United States Patent
Boehm et al.

(10) Patent No.: US 11,334,435 B2
(45) Date of Patent: May 17, 2022

(54) SAFETY EVENT DETECTION FOR A MEMORY DEVICE

(71) Applicant: Micron Technology, Inc., Boise, ID (US)

(72) Inventors: Aaron P. Boehm, Boise, ID (US); Scott E. Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 119 days.

(21) Appl. No.: 16/839,438

(22) Filed: Apr. 3, 2020

(65) Prior Publication Data

US 2020/0341847 A1 Oct. 29, 2020

Related U.S. Application Data

(60) Provisional application No. 62/840,027, filed on Apr. 29, 2019.

(51) Int. Cl.
  *G06F 11/14* (2006.01)
  *G06F 13/16* (2006.01)
  (Continued)

(52) U.S. Cl.
  CPC ........ *G06F 11/1415* (2013.01); *G06F 3/0619* (2013.01); *G06F 13/1668* (2013.01);
  (Continued)

(58) Field of Classification Search
  CPC ............... G06F 11/1415; G06F 3/0619; G06F 13/1668; G06F 2201/82; G06F 2201/81;
  (Continued)

(56) References Cited

U.S. PATENT DOCUMENTS 7,233,538 B1 * 6/2007 Wu ................. G11C 11/406
  365/222
10,839,886 B2 * 11/2020 Yuan ................ G11C 16/10
  (Continued)

FOREIGN PATENT DOCUMENTS

KR 20050054001 A 6/2005

OTHER PUBLICATIONS

ISA/KR, International Search Report and Written Opinion of the International Searching Authority, Int'l Appl. No. PCT/US2020/027363, dated Jul. 21, 202, Korean Intellectual Property Office, Seo-gu, Daejeon, Republic of Korea, 12 pgs.

*Primary Examiner* — Ajay Ojha
(74) *Attorney, Agent, or Firm* — Holland & Hart LLP

(57) ABSTRACT

Methods, systems, and devices for performing safety event detection for a memory device are described. For example, a memory array of a memory device may operate in a first mode of operation (e.g., a normal mode of operation). An event associated with a reduction of data integrity for the memory array may be detected. In some cases, the event may be associated with a temperature of the memory device, a voltage level detected at the memory device, an error event at the memory device, or the like. Based on the detected event, it may be determined whether to adjust the operation of the memory device to a second mode of operation (e.g., a safe mode of operation). The second mode of operation may correspond to a mode of operation that increases data retention characteristics.

25 Claims, 10 Drawing Sheets

(51) Int. Cl.
*G11C 11/406* (2006.01)
*G06F 3/06* (2006.01)
*G11C 11/401* (2006.01)

(52) U.S. Cl.
CPC .......... *G11C 11/401* (2013.01); *G11C 11/406* (2013.01); *G06F 2201/82* (2013.01)

(58) Field of Classification Search
CPC . G06F 11/3037; G06F 11/3058; G11C 11/401
See application file for complete search history.

(56) References Cited

U.S. PATENT DOCUMENTS

| | | |
|---|---|---|
| 2009/0046512 A1 | 2/2009 | Halloush et al. |
| 2014/0258786 A1 | 9/2014 | Resnick |
| 2016/0203863 A1 | 7/2016 | Chien et al. |
| 2017/0047124 A1 | 2/2017 | Ellis et al. |

* cited by examiner

SAFETY EVENT DETECTION FOR A MEMORY DEVICE

CROSS REFERENCE

The present Application for Patent claims the benefit of U.S. Provisional Patent Application No. 62/840,027 by BOEHM et al., entitled "SAFETY EVENT DETECTION FOR A MEMORY DEVICE," filed Apr. 29, 2019, assigned to the assignee hereof, and expressly incorporated by reference herein.

BACKGROUND

The following relates generally to a memory system, and more specifically to safety event detection for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., SRAM, DRAM, may lose their stored state over time when disconnected from an external power source.

For some types of memory (e.g., DRAM, other volatile memory), the data integrity at a memory device may depend on various parameters of the memory device. Improving memory devices, generally, may include increasing memory cell density, increasing read/write speeds, increasing reliability, increasing data integrity, reducing power consumption, or reducing manufacturing costs, among other metrics.

DETAILED DESCRIPTION

Figure 1:
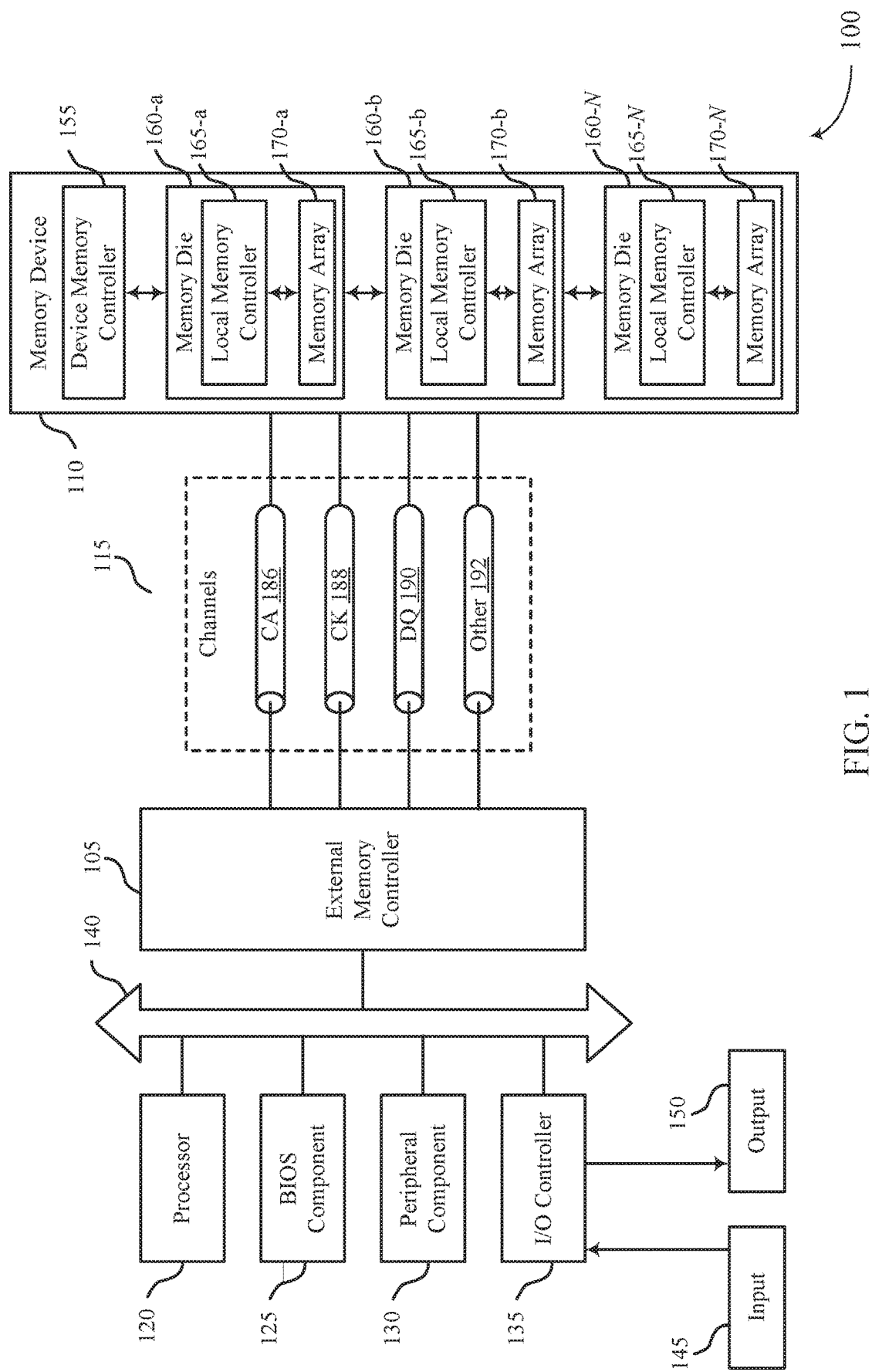
FIG. 1 illustrates an example of a system that supports safety event detection for a memory device as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry standards or specifications (e.g., higher reliability parameters).

Some memory cells, such as dynamic memory cells, may experience a loss of data integrity due to events occurring at the memory device. The safety event may be an event that causes the memory cells to exhibit an increased probability of deterioration (loss) of a stored logic state over time. For example, memory cells that utilize a capacitive storage element (e.g., DRAM memory cells) may lose a stored state or have a stored state change to a different state, such as due to some amount of charge leaking from a storage element (e.g., capacitor). Without intervention, such as refreshing the logic state by rewriting the memory cell (e.g., recharging the storage element), the logic state stored by the memory cell may be lost or corrupted. In some cases, events such as extreme temperatures, row hammer events, or an insufficient voltage supply at the memory device, may cause the memory cells to exhibit deterioration at a faster pace. In some other cases, certain events at the memory device may impact the reliability of the memory device. For example, the memory device reliability may decrease in the event of an access command execution error, an error condition for a channel of a bus between the memory device and a host device, or an invalid command. In some cases, the memory device may adapt the operation mode of the memory device to compensate for the decreased data integrity associated with the events.

Techniques for safety event detection for a memory device are described. For example, the memory device may detect an event at the memory device that may be associated with a decrease in data integrity. The event may include one or more of an execution error, a quantity of row access commands that satisfies a first threshold, a refresh rate that does not satisfy a second threshold, an error condition for a channel of a bus, an invalid command, a temperature condition, or a voltage condition. As a result, the memory device may determine whether to adjust the mode of operation of the memory device to a safe mode of operation. The safe mode of operation may be a mode of operation to increase the data retention characteristics of the memory device. For example, the safe mode may include increasing a refresh rate of the memory array, adjusting a bus configuration of the memory device, blocking one or more commands from the host device, blocking commands to one or more banks or sections of the memory array, operating one or more banks of the memory array according to a self-refresh mode, adjusting a speed configuration for access to the memory array, or a combination thereof.

Features of the disclosure are further described below in the context of memory systems and a memory device with reference to FIGS. 1-3. Features of the disclosure are then described in the context of process flows with reference to FIGS. 4 through 6. These and other features of the disclosure are further illustrated by and described with reference to apparatus diagrams and flowcharts in FIGS. 7-10 that relate to safety event detection for a memory device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, inputs 145, or outputs 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. One or more memory arrays 170 may include a row access logic component and a column access logic component. The row and column access logic components may determine a subset of the memory array 170 accessed during an access operation indicated by the external memory controller 105. In some examples, the subset of the memory array 170 may indicate the subset along one or more dimensions of the array. The memory array 170 may indicate the subset to a device memory controller 155, a local memory controller 165, the external memory controller 105, or an event detection circuit (e.g., as discussed in more detail with reference to FIG. 3). The system may compare the subset to an address indicated by the access operation in order to detect errors associated with decoding and/or executing the access command. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. In some cases, the quantity of signal paths of a channel may correspond to a bus width of that channel. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, a quantity of signal paths in data channels 190 (e.g., a data bus) may correspond to the width of the data channels 190. The device memory controller 155 may support a flexible data bus width. For example, the memory device 110 may operate according to a first data channel configuration (e.g., the data bus operating according to a first width corresponding to using all of the data channels 190). The device memory controller 155 may indicate to adjust the first data channel configuration to a second data channel configuration. That is, the memory device 110 may transfer data using a subset of the signal paths of data channels 190. As such, the second data channel configuration may correspond to the data bus operating according to a second width that is less than the first width.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
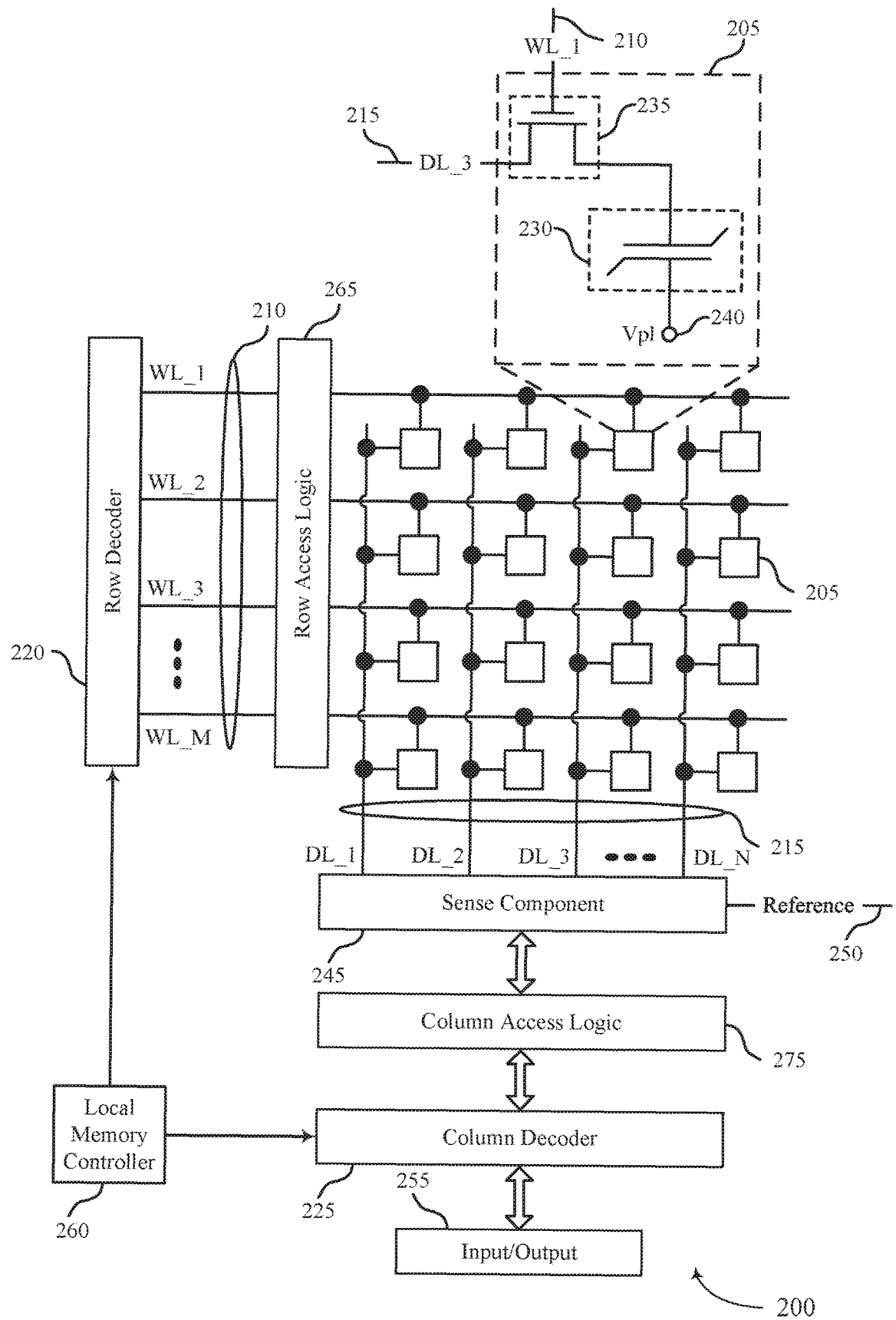
FIG. 2 illustrates an example of a memory die that supports safety event detection for a memory device as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 (or a row of memory cells 205) that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component. Some memory cells 205 may lose a stored state or have the stored state change to a different state in the event of frequent row activations (e.g., corresponding to frequent word line activations), or row hammering. That is, if a single row, group of rows, or pattern of rows are accessed with a relatively high frequency, the memory state for victim rows (e.g., adjacent or proximate rows) may be affected. For example, memory cells 205 may lose their stored data absent periodical refresh of the data, and row hammering may cause memory cells 205 to lose a stored state or have the stored state change to a different state over less time (e.g., faster than a refresh cycle).

The memory die 200, which may be an example of a memory sub-array, may include row access logic 265. The row access logic 265 may be coupled to the word lines 210 or to portions of row decoder 220. The row access logic 265 may be configured to determine a word line 210 that is activated during an access operation. In some cases, the row access logic 265 may determine a single word line 210 that is activated during the access operation. In some other region, the row access logic 265 may determine a subset of word lines 210 including the word line that is activated during the access operation. The row access logic 265 may be configured to transmit an indication of the word line or lines 210 that are activated during the access operation to a component (e.g., a verifier as described herein 235).

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215. The memory die 200 may include column access logic 275. The column access logic 275 may be coupled to the column decoder 225 or the sense component 245. The column access logic 275 may be configured to determine a digit line 215 that is selected during an access operation. In some cases, the column access logic 275 may determine a single digit line 215 that is selected during the access operation. In some other cases, the column access logic 275 may determine a subset of digit lines 215 that are selected (or that include one or more digit lines that are selected) during the access operation. The column access logic 275 may be configured to transmit an indication of the digit line or lines 215 that are selected during the access operation to a component (e.g., a verifier as described herein).

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. In some cases, data may be communicated from the memory die 200 to the device memory controller 155 according to a prefetch width. The prefetch width may be a function of the data bus width. For example, the prefetch width may be given by Xn, where X is a multiplier (e.g., 2, 4, 8, 16), and n is the data bus width. The multiplier X may, for example, equal a burst length (e.g., the quantity of bits transmitted via each data pin of the DQ channel 190 as described with reference to FIG. 1) for accesses to the memory die 200. In some cases, the prefetch width may be static (e.g., a hardwired characteristic of the memory device).

The device memory controller 155 may indicate a bus width for data communications between the memory device and an external memory controller (e.g., a host device). In some cases, this bus width may be variable. For example, a maximum bus width for data communications between the memory device and the external memory controller may correspond to using each of the possible signal paths (e.g., using each available data pin). In some cases, the device memory controller 155 may indicate for a subset of the signal paths to be used (e.g., corresponding to a subset of the data pins being used). In some cases, this may allow the device memory controller 155 to avoid data pins and/or signal paths that may be faulty. In some cases, the prefetch width may not change when a subset of the signal paths are used (e.g., may be determined based on the maximum or full bus width).

The local memory controller 260 may determine whether received commands are defined prior to translating the commands into information that can be used by the memory die 200. That is, the local memory controller 260 may compare received commands to a set of defined commands. In the event that the received command is included in the set of defined commands, the local memory controller may decode the commands into information that can be used by the memory die 200. Alternatively, in the event that the received command is not included in the set of defined commands (e.g., the received command is undefined/invalid), the local memory controller 260 may block the command from being translated and propagated to the memory die 200.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

The row access logic 265 and the column access logic 275 may determine a subset of the array corresponding to the target memory cell 205. That is, the row access logic 265 and the column access logic 275 may be configured to determine the word line or lines 210 activated by the write operation and the digit line or lines 215 that convey data associated with the write operation. The row access logic 265 and the column access logic 275 may transmit an indication of the determined subset of the array (e.g., to a verifier as discussed herein). In some examples, the indication of the subset of the array may indicate the subset along one or more dimensions of the array. For example, the indication of the subset of the array may indicate the word line or lines 210 being activated during the write operation (e.g., a row matrix (MAT) indication). Additionally or alternatively, the indication of the subset of the array may indicate the digit line or lines 215 selected during the write operation (e.g., a column MAT indication).

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

The row access logic 265 and the column access logic 275 may determine a subset of the array corresponding to the target memory cell 205. That is, the row access logic 265 and the column access logic 275 may be configured to determine the word line or lines 210 activated during the read operation and the digit line or lines 215 carrying the data associated with the read operation. The row access logic 265 and the column access logic 275 may transmit an indication of the determined subset of the array (e.g., to a verifier as discussed herein). In some examples, the indication of the subset of the array may indicate the subset along one or more dimensions of the array. For example, the indication of the subset of the array may indicate the word line or lines 210 being activated during the read operation (e.g., a row MAT indication). Additionally or alternatively, the indication of the subset of the array may indicate the digit line or lines 215 selected during the read operation (e.g., a column MAT indication).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The local memory controller 260 may operate according to either an automatic refresh mode or a self-refresh mode. In an automatic refresh mode, the local memory controller 260 may receive refresh commands for refreshing the memory die 200 from a host device (e.g., from external memory controller 105). The automatic refresh mode may be used in a default or normal operation of the memory device where the memory device receives and executes memory commands. In the automatic refresh mode, the local memory controller 260 may perform a refresh operation when it receives each refresh command, where each refresh operation includes refreshing one or more rows of the memory array.

In a self-refresh mode, the local memory controller 260 may initiate the refresh operations. The self-refresh mode may be used in a low-power or standby state of the memory device, where the memory device may not receive memory commands including refresh commands. In self-refresh mode, the local memory controller 260 may refresh memory cells 205 using an internal oscillator, internal counters, or the like. In either mode, the local memory controller 260 may determine a refresh rate according to the conditions of the memory die 200. The refresh rate may correspond to the inverse of a periodicity that each of the memory cells 205 are refreshed.

The local memory controller 260 may detect an event at the memory device that may be associated with a decrease in data integrity. As a result, the local memory controller 260 may determine to adjust the refresh rate of the memory die 200 to preserve data integrity. When the local memory controller 260 is operating according to an automatic refresh mode, the local memory controller 260 may increase a quantity of rows (e.g., memory cells at one or more physical rows of the memory die 200) that are refreshed in response to receiving each refresh command from a host device.

For example, in order to increase the refresh rate by a factor of two (2), the local memory controller 260 may double the quantity of rows of the memory die 200 that are refreshed in response to a single refresh command. When the local memory controller 260 is operating according to a self-refresh mode, the local memory controller 260 may adjust timing parameters or a quantity of rows of the memory die 200 that are refreshed in a single refresh operation. For example, in order to increase the refresh rate of memory die 200, the local memory controller 260 may decrease the periodicity of refresh operations or may increase a quantity of rows of the memory die 200 that are refreshed during the execution of a single refresh operation, or may adjust both parameters in combination.

Figure 3:
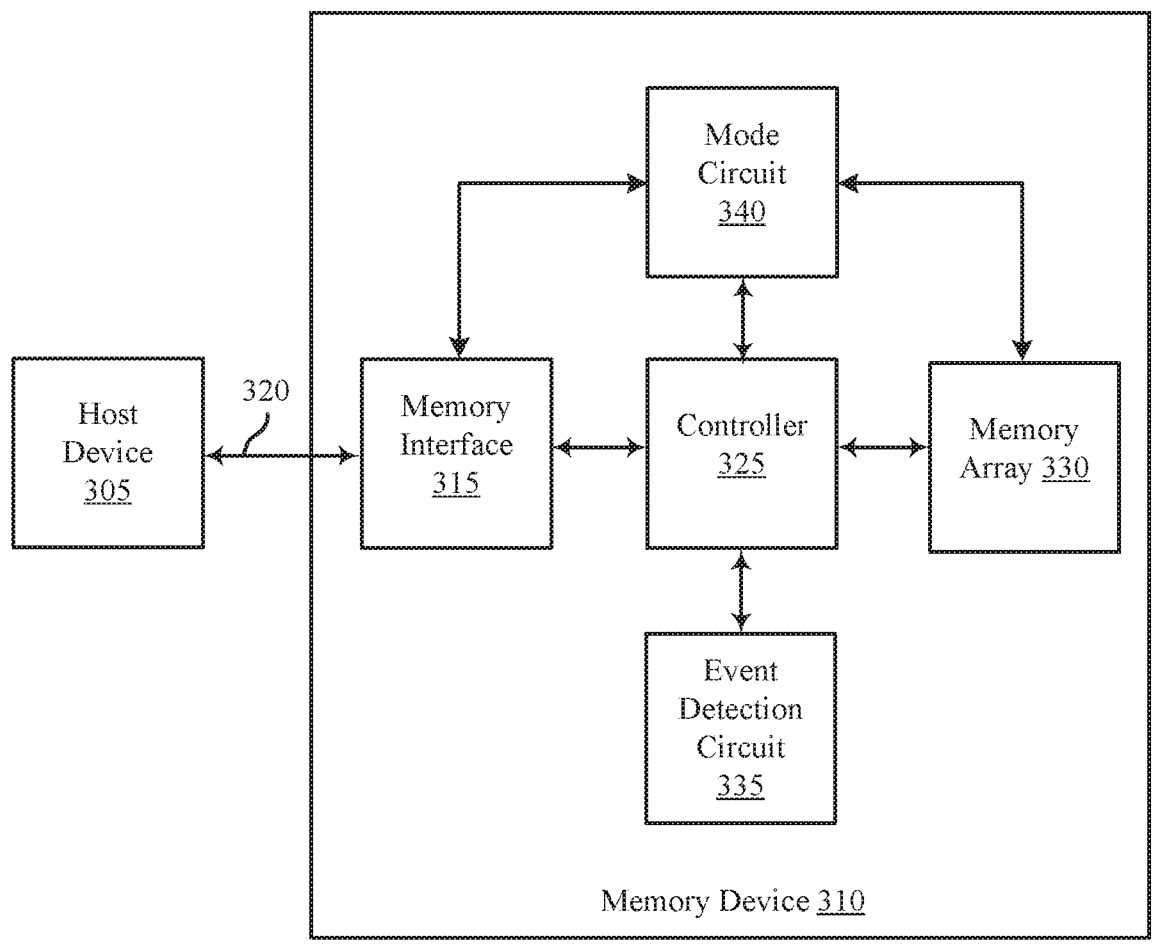
FIG. 3 illustrates an example of a system that supports safety event detection for a memory device as disclosed herein.

FIG. 3 illustrates an example of a system 300 that illustrates a memory device configured for safety event detection as disclosed herein. The system 300 may include one or more components described herein with reference to FIGS. 1 and 2, among others. For example, the system 300 may include a host device 305, which may be an example of the external memory controller 105 as described with reference to FIG. 1; a memory device 310, which may be an example of the memory device 110, the memory dice 160, or the memory die 200 as described with reference to FIGS. 1 and 2; a controller 325, which may be an example of the device memory controller 155, one or more local memory controllers 165, or the local memory controller 260 as described with reference to FIGS. 1 and 2, or any combination thereof; a memory array 330, which may be an example of the memory arrays 170 as described with reference to FIG. 1. The memory device 310 may also include an event detection circuit 335 and a mode circuit 340.

Host device 305 may send commands by a channel 320, which may be an example of a channel 115 such as the CA channel 186 or the DQ channel 190 as discussed with reference to FIG. 1. The commands may be received by the memory device 310, for example by the memory interface 315. A command may include an instruction for an access operation (e.g., a read operation, a refresh operation, a write operation) at memory array 330 on the memory device 310. The command may further include an address of the memory array 330 targeted by the access operation. The address may comprise a row address and a column address corresponding to a row and column(s) (e.g., physical or virtual) of the memory array 330. Memory array 330 may include one or more memory banks, each of which may include one or more rows and/or one or more columns. The command may be associated with an activation (e.g., read, write, etc.) for a row address within memory array 330. Controller 325 may execute multiple access commands (e.g., an access command pattern) on memory array 330, thus accessing a pattern of banks, rows, and/or columns within memory array 330.

In some instances, the command may include a data transfer operation. For example, in a read operation, data may be transferred from the memory array 330 to the host device 305. In another example, data may be transferred from the host device 305 to the memory array 330 in a write operation. The data may be transferred (between the host device 305 and the memory device 310) by a data channel (e.g., DQ channel 190) within the channel 320. The controller 325 may receive commands from the memory interface 315, process the commands, and execute the commands on memory array 330.

Controller 325 may operate the memory device 310 according to various modes of operation. In a first mode of operation, which may also correspond to a normal mode of operation, the controller 325 may operate the memory device according to a default configuration. The default configuration may include the memory device 310 operating according to some preconfigured parameters. The preconfigured parameters may include parameters for the memory device 310 that are defined by a specification associated with the memory device 310. The parameters may include a command set for the memory device 310, voltage levels for the memory device 310 (e.g., a voltage level for a power supply for the memory device 310), timing parameters (e.g., a clock rate, refresh rate), etc.

The controller 325 may determine to adapt the mode of operation of the memory device 310 based on the data integrity of the memory device 310. For example, the controller 325 may determine (e.g., based on an indication from the event detection circuit 335) an occurrence of an event that relates to the data integrity of the memory device 310. Here, the controller 325 may adjust the mode of operation of the memory device 310 from the first (e.g., normal) mode of operation to a second (e.g., safe) mode of operation. The safe mode of operation may correspond to a mode of operation that may limit a decrease in data integrity as a result of the detected event.

The event detection circuit 335 may detect events that affect the data integrity of the memory device 310. The event detection circuit 335 may include a single circuit for detecting events or more than one circuit (e.g., at various locations at the memory device 310) for detecting different types of events. In a first example, the event detection circuit 335 may detect that a command received from the host device 305 has not been executed properly at the memory device 310. For example, the event detection circuit 335 may detect that a command received from the host device 305 may have been incorrectly decoded (e.g., by the controller 325) and therefore may have resulted in an incorrect access instruction and/or address. In one case, the event detection circuit 335 may determine that the controller 325 experienced a decoding error when attempting to decode the access instruction. Here, the event detection circuit 335 may receive an indication of decode failure from the controller 325. In another case, the event detection circuit 335 may compare the type of access instruction determined by the controller 325 (e.g., based on a decoding of the command) to the raw command data received at the memory interface 315 (e.g., prior to the decoding by the controller 325). The event detection circuit 335 may determine the type of access instruction indicated by raw command data (e.g., by a similar or logically equivalent decoding method as employed by the controller 325). If the type of access instruction indicated by the controller 325 does not match the type of access instruction determined by the event detection circuit 335, the event detection circuit 335 may determine that an event associated with decreased data integrity has occurred.

In another case, the event detection circuit 335 may determine that the command was not executed at the correct address. For example, the event detection circuit 335 may receive an indication from the memory array 330 (or circuitry associated with the memory array 330 such as the row access logic 265 and/or the column access logic 275 as discussed with reference to FIG. 2) of the portion of the memory array 330 that was accessed during the execution of the command. The indication may include an identifier for the accessed portion (e.g., a row identifier, a column identifier, a row MAT identifier, a column MAT identifier). A row MAT may refer to a single word line, a subset of word lines of one or more sub-arrays, a sub-array, or the like. A column MAT may refer to a single column, a subset of columns of one or more sub-arrays, a sub-array, or the like. In some cases, each column corresponds to a digit line. The event detection circuit 335 may also receive the command from the memory interface 315. In this example, the event detection circuit 335 may compare the expected address determined at the event detection circuit 335 (e.g., based on the command received from the memory interface 315) to the accessed portion indicated by the memory array 330 (e.g., at a comparator of the event detection circuit 335). The event detection circuit 335 may detect an event associated with a decrease in data integrity if the accessed portion does not match a portion of the memory array 330 indicated by the expected address.

In a second example, the event detection circuit 335 may detect a row hammer event at the memory array 330. Here, the event detection circuit 335 may include circuit components configured to determine a row access metric. The event detection circuit 335 may include a counter, a timer, or the like. The row access metric may indicate a quantity of related accesses (e.g., a quantity or pattern of accesses to the same or similar rows, banks, etc.). Event detection circuit 335 may receive an indication of the accesses (e.g., access commands received from host device 305) from the memory interface 315 or the controller 325. That is, during a normal mode of operation, the controller 325 may execute access commands received from the host device 305 on the memory array 330. The controller 325 may further provide an indication of the accesses to the event detection circuit 335. Based on the accesses, the event detection circuit 335 may determine a quantity of related accesses and compare the row access metric with a threshold (e.g., a preconfigured or programmed threshold indicating a quantity of related accesses that may correspond to a row hammer event). The event detection circuit 335 may detect an event associated with a decrease in data integrity if it detects a row hammer event, as row hammering may negatively impact the data retention of one or more cells of the memory array 330.

In a third example, the event detection circuit 335 may determine that the current refresh operations of the memory device 310 do not satisfy an industry standard or specification for the memory device 310 (e.g., the refresh operations do not satisfy a refresh rate parameter). Here, the event detection circuit 335 may determine a current refresh rate (e.g., the time it takes to refresh the memory array 330 based on a current refresh operation execution periodicity in combination with a quantity of rows of the memory array 330 that are refreshed during the execution of each refresh operation) and compare the current refresh rate to the refresh rate parameter. The event detection circuit 335 may detect an event associated with decreased data integrity if the current refresh rate is less than the refresh rate parameter.

In a fourth example, the event detection circuit 335 may determine that a DQ channel may be faulty. For example, a data pin associate with the DQ channel may be shorted, open, or cross-coupled. In some cases, the event detection circuit 335 may determine an error associated with one or more data pins of the DQ channel. In some cases, the event detection circuit 335 may collect data to determine the error. For example, the event detection circuit 335 may detect a short on the data pins by detecting that a voltage on the data pin (e.g., a driven state of the data pin) is not the same as the output of the memory interface 315. Additionally or alternatively, the event detection circuit 335 may include current sensing circuitry. Here, the event detection circuit 335 may determine opens, shorts, or cross-coupling using the current sensing circuitry applied to the data pins. The event detection circuit 335 may detect an event associated with a decrease in data integrity in the event of detecting the faulty DQ channel as communications between the host device 305 and the memory device 310 may be erroneous and/or incomplete.

In a fifth example, the event detection circuit 335 may determine that a command received from the host device 305 is not defined. A defined command may be a command associated with a defined instruction (e.g., a read instruction, a write instruction, a refresh instruction, etc.) and/or a defined address (e.g., row address, column address). The event detection circuit 335 may determine whether a received command is included in a set of commands that are defined for the memory device 310. The memory device 310 may store a set of defined commands. The event detection circuit 335 may utilize circuitry (e.g., a look-up table (LUT), a simplified processor circuitry implementing a logic function) to determine whether the received command is within the set of defined commands. In the case that the memory device 310 receives an undefined command or command sequence, the response of the memory device 310 may be variable or unknown. Therefore, when the event detection circuit 335 determines that the received command is not part of the set of defined commands, the event detection circuit 335 may detect an event associated with a decrease in data integrity.

In a sixth example, the event detection circuit 335 may detect a temperature of the memory device 310. The event detection circuit 335 may detect an event associated with decreased data integrity when the temperature of the memory device 310 exceeds a certain threshold (e.g., the temperature of the memory device 310 is too high or too low). In a seventh example, the event detection circuit 335 may measure certain voltage levels of the memory device 310 (e.g., a voltage level of a power supply for the memory device 310). The event detection circuit 335 may detect an event associated with decreased data integrity if a measured voltage level goes below a threshold voltage level (e.g., for a certain time or a certain quantity of times within a time period).

The thresholds (e.g., for detecting events associated with decreased data integrity) may be preconfigured at the memory device 310. Additionally or alternatively, the thresholds may be indicated (e.g., through the memory interface 315) by the host device 305. In some cases, the thresholds may be codependent. That is, the thresholds for events (e.g., temperature events, voltage events, error events) may be based on the combination of multiple detected events. For example, if the event detection circuit 335 detects a first temperature and first voltage condition (e.g., a nominal voltage) at the memory array 330, the event detection circuit 335 may not detect an event associated with a decreased data integrity. However, if the event detection circuit 335 detects the first temperature in combination with a second voltage condition (e.g., a low voltage supply condition), the event detection circuit 335 may detect an event associated with a decreased data integrity. The memory device 310 may store codependent thresholds, which may be predetermined or configurable. For example, the events may correspond to event indices, and the memory device 310 may look up combinatorial events according to the indices and codependent thresholds for the combinatorial event. The host device 305 may configure the codependent thresholds or add combinatorial events by configuring a new event index and the corresponding event indices and codependent thresholds for the new combinatorial event.

When the event detection circuit 335 detects an event associated with decreased data integrity for the memory device 310, the event detection circuit 335 may indicate (e.g., flag) the event to the controller 325. In some cases, the event detection circuit 335 may transmit a notification of the event to the controller 325 when the event is detected. Alternatively, the controller 325 may poll a flag set by the event detection circuit 335 periodically to determine if the event detection circuit 335 has detected an event associated with a decreased data integrity. The notification may indicate an occurrence of the detected event to the controller 325. Additionally or alternatively, the notification may indicate additional information related to the detected event to the controller 325 (e.g., a type of the detected event). For example, if the event detection circuit 335 determines that the row access metric satisfies the threshold, the event detection circuit 335 may indicate a row hammer event to controller 325. In some cases, the notification may further include information indicating for which row or rows (e.g., group of rows, bank) the row access metric satisfies the threshold.

When the controller 325 receives the indication of the event (e.g., from the event detection circuit 335), the controller 325 may transmit some status information indicating the event to the host device 305 (e.g., by the memory interface 315). The controller 325 may determine whether to transmit the status information to the host device 305 based on a severity of the event. For example, the controller 325 may not transmit status information indicating the event if the controller 325 determines that the severity of the event does not meet a threshold severity. The threshold severity may be a preconfigured threshold (e.g., hardwired on the memory device 310). In some other instances, the threshold severity may be a programmable value (e.g., by the host device 305).

The status information may be communicated by the memory interface 315. For example, the memory device 310 may transmit the status information by a pin of the memory interface 315. In some cases, the pin may be multifunctional (e.g., used to transmit data or other types of signaling as well). For example, the memory device 310 may multiplex the status information with some other signals being communicated from the memory device 310 to the host device 305. In some other cases, the pin may be dedicated for the status information. Additionally or alternatively, the memory device 310 may include the status information within a data packet and transmit the status information via the memory data interface. In another example, the memory device 310 may transmit the status information by a sideband communication scheme (e.g., by a communication bus other than the memory data interface such as an inter-integrated circuit ($I^2C$) bus).

The memory device 310 may determine to adapt the mode of operation of the memory device 310 from the normal mode of operation to the safe mode of operation based on detecting the event associated with a decrease in data integrity. In some cases, the controller 325 of the memory device 310 may determine to autonomously adapt the mode of operation to the safe mode of operation based on receiving the indication of the event from the event detection circuit 335. For example, the mode circuit 340 may determine whether the event detected by the event detection circuit 335 is severe enough to warrant a transition to a safe mode of operation. Here, the mode circuit 340 may compare the detected event to a configuration for operation adjustment. The configuration for operation adjustment may indicate whether, for various detected events, to adjust the mode of operation to a safe mode. For example, the configuration for operation adjustment may be a bitmap indicating whether an autonomous operation adjustment is configured for various types of detected events. The configuration for operation adjustment may be a characteristic of the memory device 310 (e.g., hardwired). In some other cases, the configuration for operation adjustment may be configurable. For example, the memory device 310 may receive, from the host device 305, an indication of the configuration for operation adjustment.

If the mode circuit 340 determines to switch to the safe mode of operation for the memory device 310, the mode circuit 340 may indicate the safe mode to the controller 325. The controller 325 may include an indication of the safe mode in the status information (e.g., transmitted to the host device 305).

In some other cases, the memory device 310 may receive an indication to adapt the mode of operation to the safe mode of operation from the host device 305. Here, the mode circuit 340 may determine a safe mode of operation for the memory device 310 and indicate the safe mode of operation to the controller 325. The controller 325 may include an indication of the safe mode of operation within the status information transmitted to the host device 305. The host device 305 may determine for the memory device 310 to operate according to the safe mode indicated within the status information (e.g., as determined by the mode circuit 340). For example, the host device 305 may determine, based on the information within the status information, whether to adjust the mode of operation of the memory device 310 to a safe mode of operation. If the host device 305 determines to transition the memory device 310 to a safe mode of operation, the host device 305 may transmit an indication to the memory device 310 to transition to the type of safe mode previously indicated within the status information, or in some cases to a different type of safe mode.

The mode circuit 340 may initiate the change of the mode of operation of the memory device 310 to the safe mode of operation. In some instances, the mode circuit 340 may adapt the mode of operation to the safe mode adaptation. In some other instances, the mode circuit 340 may determine to adapt the mode of operation to a certain safe mode of operation and indicate the certain safe mode of operation to the controller 325. Here, the controller 325 may operate the memory device 310 according to the certain safe mode of operation.

The safe mode of operation may correspond to a mode of operation that may prevent or limit a decrease in data integrity as a result of the detected event. There may be multiple modes of operation of the memory device 310 that correspond to a safe mode of operation. The mode circuit 340 may determine a type of operation for a safe mode of operation based on a type of event detected by the event detection circuit 335. The mode circuit 340 may indicate a safe mode of operation by setting a mode register. In another case, the mode circuit 340 may indicate the safe mode of operation to the controller 325. Here, the controller 325 may issue a command to enter into the safe mode of operation. In another example, the memory device 310 may receive an indication to operate according to a safe mode of operation.

In a first example, the safe mode of operation may correspond to adapting the refresh rate of the memory array 330. In a case when memory device 310 is operating according to an automatic refresh mode, the controller 325 or the mode circuit 340 may adapt a quantity of rows executed per refresh command (e.g., as received from the host device 305). For example, the mode circuit 340 may determine to increase the refresh rate of the memory array 330 (e.g., based on an indication received from the event detection circuit 335 or the controller 325) and increase the quantity of rows refreshed per refresh command (e.g., from four rows to six, eight, ten, twelve, or sixteen rows). In the case when the controller 325 is operating according to a self-refresh mode, the controller 325 or the mode circuit 340 may adapt a periodicity of the refresh operations and/or the quantity of rows refreshed per refresh operation.

In a second example, the safe mode of operation may correspond to adjusting the set of active data pins. During the normal mode of operation, the memory device 310 may utilize each of the data pins associated with the channel 320. However, during a safe mode of operation, the mode circuit 340 may provide an indication to the controller 325 or the memory interface 315 of a subset of the data pins that are active. The subset of the data pins may be any intermediate quantity of the total quantity of data pins at the memory device 310. The burst length may change according to the quantity of active data pins (e.g., the quantity of data bits transmitted via the data pins for an access operation). The mode circuit 340 may determine a set of active data pins based on an error detected by the event detection circuit 335. Thus, the system 300 may increase reliability by configuring an active set of data pins based on detected errors associated with one or more data pins.

In a third example, the safe mode of operation may correspond to blocking certain access commands (e.g., external commands as received from the host device 305). In a first example, the mode circuit 340 or the controller 325 may block undefined commands. For example, the event detection circuit 335 may determine that a command received from the host device 305 is undefined (e.g., not included in the set of defined commands). Here, the mode circuit 340 may block the execution of the undefined command. In another example, the mode circuit 340 may block the execution of other commands. For example, the mode circuit or the controller 325 may apply a restriction of access to at least a portion of the memory array 330. Here the controller 325 or the mode circuit 340 may block the execution of commands to one or more portions (e.g., rows, columns, sub-arrays, banks, bank groups) of the memory array 330 subject to the restriction of access. In some other examples, the controller 325 or the mode circuit 340 may not execute any defined commands during the safe mode. In some other examples, the controller 325 or the mode circuit 340 may not execute certain types of defined commands during the safe mode (e.g., the memory device 310 may execute read commands during a safe mode, but may not execute other types of commands).

In a fourth example, the safe mode may correspond to preventing row accesses to one or more portions of the memory array 330. Here, the mode circuit 340 may block access commands corresponding to the one or more portions of the memory array 330. This safe mode may limit a decrease in data integrity in a case where the event detection circuit 335 detects a row hammer event at the one or more portions of the memory array 330. For example, the blocked access commands may correspond to row accesses for the memory array 330 at one or more portions of the memory array 330 associated with a potential row hammer event. In one case, the safe mode may include the controller 325 or the mode circuit 340 blocking access commands to each of the banks for memory array 330. In another example, the safe mode may include the controller 325 or the mode circuit 340 blocking access commands to a single bank (e.g., a bank associated with the detected row hammer event). Here, the controller 325 or the mode circuit 340 may block access commands to the single bank while the remaining banks within the memory array 330 may continue to operate in an access mode (e.g., the controller 325 may propagate access commands to the remaining banks). During the safe mode, the controller 325 may initiate a refresh operation for the bank or banks associated with the safe mode.

In a fifth example, the safe mode may correspond to the memory array 330 executing a self-refresh operation. Here, the mode circuit 340 may indicate a safe mode of operation where the memory device 310 initiates a refresh operation of one or more portions of the memory array 330. In some cases, the portions of the memory array 330 may correspond to a portion of the memory array 330 associated with an event detected by the event detection circuit 335. Thus, the refresh operation may maintain the memory cell states of the memory array 330, thus increasing data integrity of the memory device 310. In a sixth example, the safe mode may correspond to the controller 325 or the mode circuit 340 adjusting a speed of operation for the memory device 310. For example, the mode circuit 340 may determine to decrease an internal clock speed of the memory device.

The mode circuit 340 may determine to implement more than one type of safe mode concurrently. For example, the mode circuit 340 may determine to implement a safe mode where the operation of the memory device 310 has been adjusted to include blocking access commands to the one or more portions of the memory array 330 as well as increasing the refresh rate of the memory array 330.

Figure 4:
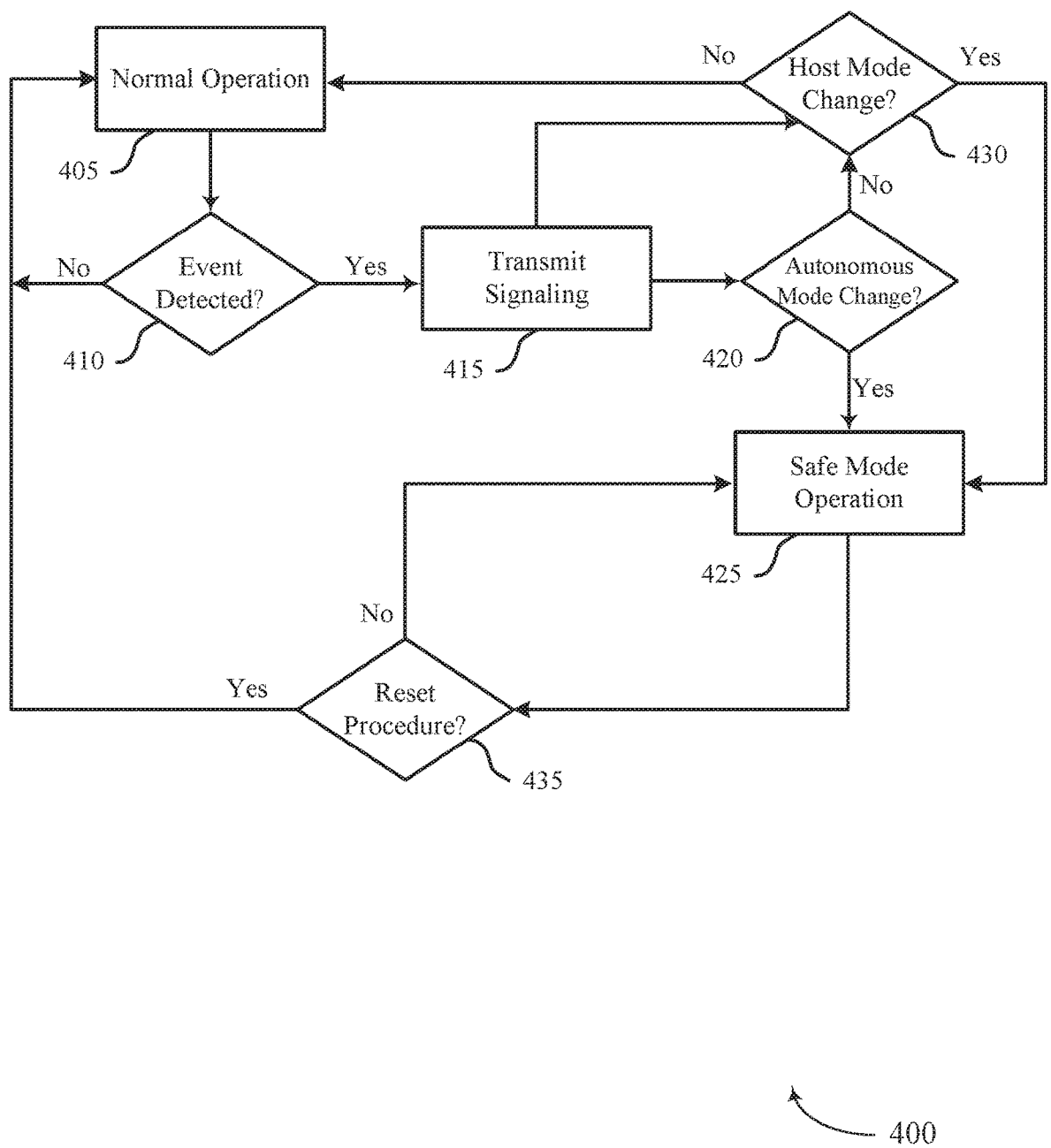
FIGS. 4 through 6 illustrates examples of process flows that support safety event detection for a memory device as disclosed herein.

FIG. 4 shows an example diagram of a process flow 400 that supports safety event detection for a memory device. The features of process flow 400 may be implemented or performed by a memory device (e.g., the memory device 110, the memory dice 160, the memory die 200, or the memory device 310 described with reference to FIGS. 1 through 3, among others) or a component of a memory device such as the device memory controller 155, the local memory controllers 165, the local memory controller 260, the controller 325, or the event detection circuit 335 as described with reference to FIGS. 1 through 3.

At 405, a memory device may be operating according to a normal mode of operation. The normal mode of operation may correspond to the memory device operating according to a default configuration. The default configuration may include the memory device operating according to preconfigured parameters. The preconfigured parameters may include parameters for the memory device that are defined by a specification from the memory device 310. The parameters may include a command set for the memory device 310, voltage levels for the memory device 310 (e.g., a voltage level for a power supply for the memory device 310), timing parameters (e.g., a clock rate, refresh rate), etc.

At 410, the memory device may determine whether an event associated with decreased data integrity is detected at the memory device. The event may correspond to one or more of an execution error, a quantity of row access commands that satisfies a first threshold, a refresh rate that does not satisfy a second threshold, an error condition for a channel of a bus, an invalid command, a temperature condition, or a voltage condition. In some cases, the memory device may use an event detection circuit (e.g., as described with reference to FIG. 3) to detect the occurrence of an event that may be associated with decreased data integrity.

In a first case, the memory device may determine at block 410 that no event associated with a decreased data integrity is detected at the memory device. Here, the memory device may continue to operate according to the normal mode of operation (e.g., as described at 405).

In a second case, the memory device may determine at block 410 that an event associated with decreased data integrity is detected. Here, the memory device may proceed to block 415. At block 415, the memory device may transmit signaling to the host device indicating the detected event. The signaling may include status information for the host device. The status information may include an indication that an event was detected. Additionally or alternatively, the status information may include an indication of the type of event that was detected. In some cases, the memory device may further include an indication of a type of safe mode of operation (e.g., that is based on the type of event that was detected). For example, the status information may indicate an event where the current refresh rate is less than the refresh rate parameter (e.g., as defined by an industry standard or specification for the memory device). Here, the status information may further indicate a safe mode where the refresh rate is doubled.

The status information may be communicated via a memory data interface of the memory device. For example, the memory device may transmit the status information by a pin of the memory data interface. In some cases, the pin may be multifunctional (e.g., used to transmit data or other types of signaling as well). For example, the memory device may multiplex the status information with some other signals being communicated from the memory device to the host device. Additionally or alternatively, the memory device may include the status information within a data packet and transmit the status information via the memory data interface. In some other cases, the pin may be dedicated for the status information. In another example, the memory device may transmit the status information by a sideband communication scheme (e.g., by a communication bus other than the memory data interface such as an I²C bus).

In a first case, the memory device may proceed to block 430 after transmitting the signaling to the host device indicating the detected event. In a second case, the memory device may proceed to block 420.

At 420, the memory device may determine whether to autonomously change the mode of operation of the memory device from the normal operation to a safe mode of operation. For example, the memory device may determine whether the event detected is severe enough to warrant a transition to a safe mode of operation. Here, the memory device (e.g., a mode circuit at the memory device as described with reference to FIG. 2) may compare the detected event to a configuration for operation adjustment. The configuration for operation adjustment may indicate whether, based on a detected events, to adjust the mode of operation to a safe mode.

In a first case, the memory device may determine to adjust the mode of operation of the memory device to a safe mode of operation. Here, the memory device may proceed to block 425 and operate according to a safe mode of operation. The safe mode of operation may correspond to a mode of operation that may prevent or limit a decrease in data integrity as a result of the detected event. The safe mode of operation may include doing one or more of increasing a refresh rate of the memory array, adjusting a bus configuration of the memory device, blocking one or more commands from the host device, blocking commands to one or more banks or sections of the memory array, operating one or more banks of the memory array according to a self-refresh mode, or adjusting a speed configuration for access to the memory array. In some cases, the memory device may determine a type of the operation for the safe mode of operation based on the safety event detected.

In a second case, the memory device may determine at block 420 not to autonomously adapt the mode of operation of the memory device to the safe mode of operation. Here, memory device may proceed to block 430. In some cases, the memory device may proceed to block 430 from block 415. That is, the memory device may be configured to transmit signaling to the host device (e.g., at block 415) and proceed to block 430 directly (e.g., rather than proceeding via block 420 to determine whether to autonomously change the mode of operation of the memory device).

At block 430, the memory device may determine whether the host initiates a change of operation of the memory device. That is, the host device may transmit an indication to the memory device indicating a change in operation to the safe mode of operation. Here, the host device may receive the indication of the event from the memory device (e.g., at block 415). Based on the indication, the host device may determine to adjust the mode of operation of the memory device to the safe mode of operation. The host device may indicate a specific mode of operation for the safe mode of operation. In some cases, the specific mode of operation for the safe mode of operation may be based on the type of mode of operation indicated within the signaling (e.g., as transmitted at block 415). Alternatively, the host device may indicate to change to a safe mode of operation and the memory device may determine a type of mode for the safe mode of operation (e.g., based on the type of event detected at block 410).

In a second case, the memory device may determine that the host has not initiated a mode change. Here, the memory device may proceed to block 405 and operate according to the normal operation.

At block 435, the memory device may identify whether a reset operation has been indicated by the host device. The reset operation may correspond to resetting the memory device from the safe mode of operation to the normal mode of operation. When the memory device determines that the reset operation has been indicated, the memory device may proceed to block 405, where the memory device will operate according to the normal operation. Alternatively, when the memory device determines that the reset operation has not been indicated, the memory device may proceed to block 425 (e.g., the memory device may continue to operate according to the safe mode of operation).

Figure 5:
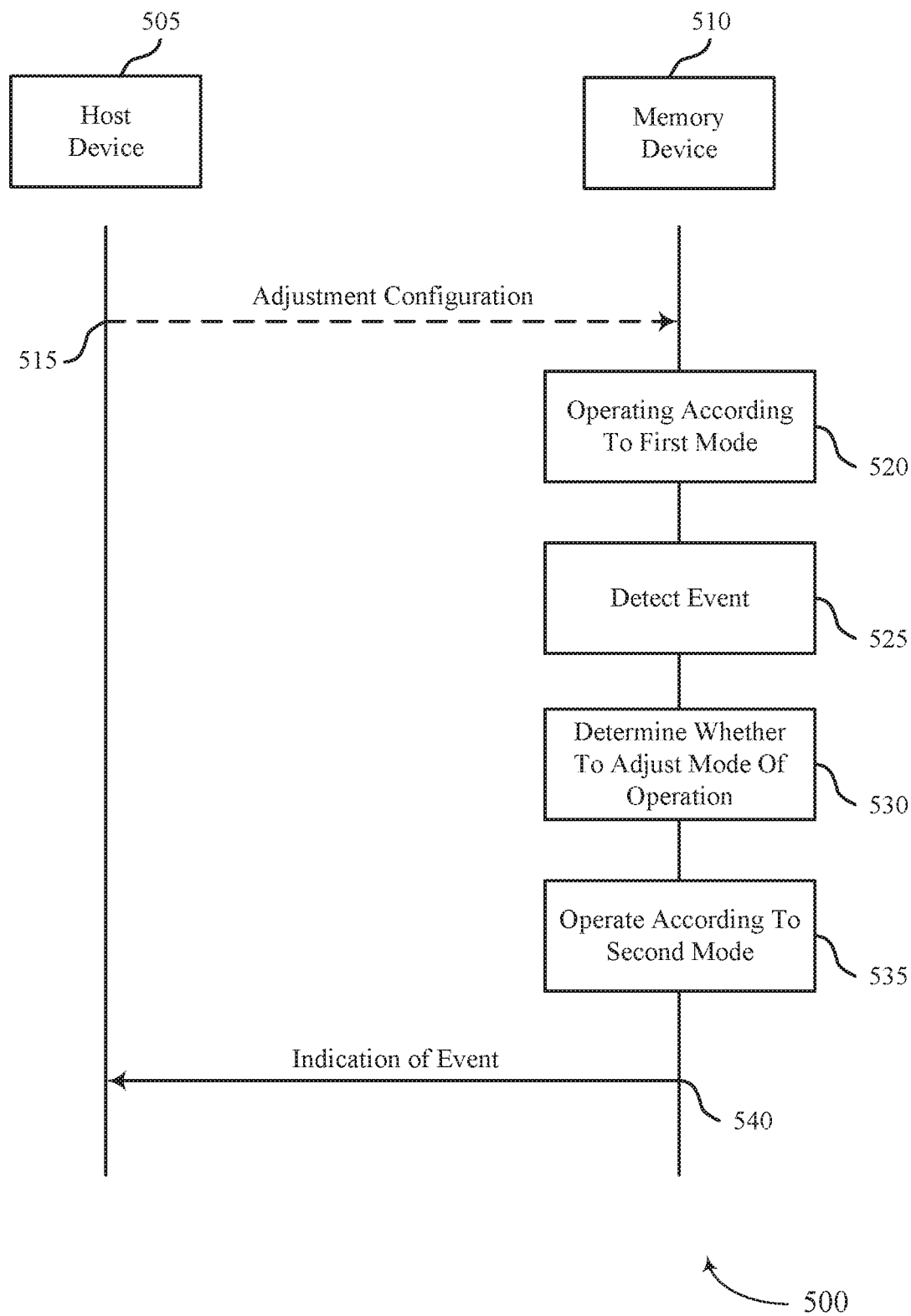

FIG. 5 illustrates an example of a process flow 500 that supports safety event detection for a memory device as disclosed herein. The process flow 500 may be implemented by aspects of the systems 100 and 300 and memory die 200 described with reference to FIGS. 1 through 3. The process flow 500 may include operations performed by a host device 505, which may be an example of host device 305 as described with reference to FIG. 3. Host device 505 may implement aspects of the external memory controller 105 as described with reference to FIG. 1. The process flow 500 may further include operations performed by a memory device 510, which may be an example of the memory device 110, the memory array 170, the memory die 200, or the memory device 310 as described with reference to FIGS. 1 through 3.

At 515, the memory device 510 may receive, from the host device 505, an adjustment configuration. The configuration for operation adjustment may be received in configuration signaling such as signaling for register settings, or the like. The configuration for operation adjustment may include a configuration for autonomous operation adjustment and/or one or more thresholds for event detection.

At 520, the memory device 510 may operate a memory array of the memory device 510 in a first mode of operation. The first mode of operation may correspond to a normal mode of operation is discussed herein.

At 525, the memory device 510 may detect an event associated with a reduction of data integrity for the memory array. The event may correspond to an execution error, a quantity of row access commands that satisfies a first threshold, a refresh rate that does not satisfy a second threshold, an error condition for a channel of a bus, an invalid command, a temperature condition, or a voltage condition, or a combination thereof.

At 530, the memory device 510 may determine whether to adjust the mode of operation of the memory device from the first mode of operation to a second mode of operation (e.g., a safe mode of operation). In some cases, the determination at 530 may be based on the event detected at 525. The memory device 510 may determine whether to adjust the mode of operation based on the adjustment configuration received from the host device 505.

In one example, the memory device 510 may determine that the detected event satisfies a condition of the adjustment configuration (e.g., the adjustment configuration indicates to perform a mode adjustment in response to the detected event). Here, the memory device 510 may autonomously adjust the operation of the memory device 510 from the first mode of operation to the second mode of operation based on determining that the detected event satisfies the condition. In some cases, the memory device 510 may adjust to the second mode of operation based on selecting the second mode of operation from a plurality of modes of operation according to the adjustment configuration. The plurality of modes of operation may include one or more of increasing a refresh rate of the memory array, adjusting a bus configuration of the memory device, blocking one or more commands from the host device, blocking commands to one or more banks or sections of the memory array, operating one or more banks or sections of the memory array according to a self-refresh mode, or adjusting a speed configuration for access to the memory array.

In another example, the memory device 510 may detect a first event that does not satisfy the condition of the adjustment configuration (e.g., the first event does not warrant an adjustment to the safe mode of operation). The memory device 510 may then detect a second event that does not satisfy the condition of the adjustment configuration (e.g., the second event does not warrant an adjustment to the safe mode of operation). The memory device 510 may determine that the combination of the first and second event satisfies the condition of the adjustment configuration according to one or more codependent thresholds (e.g., the combination of the first and second events warrants an adjustment to the safe mode of operation). In a third example, the memory device may determine that the detected event does not satisfy the condition of the adjustment configuration and continue to operate the memory array of the memory device 510 according to the first mode of operation.

At 535, the memory device 510 may optionally operate the memory device 510 according to the second mode of operation. That is, at 530 the memory device 510 may determine to adjust the mode of operation of the memory device 510 to the second mode of operation.

At 540, the memory device 510 may transmit an indication of the event (e.g., as detected at 525). That is, the memory device 510 may transmit signaling including the indication of the event. If the memory device 510 determines to adjust the mode of operation of the memory device 510 to the second mode of operation, the signaling may include an indication of the adjustment of the operation of the memory device 510 from the first mode of operation to the second mode of operation. In some cases, the signaling may include an indication of adjusting the operation of the memory device 510 (e.g., to a safe mode of operation). The signaling may include an indication of the selected second mode of operation (e.g., the type of safe mode of operation selected by the memory device 510).

Figure 6:
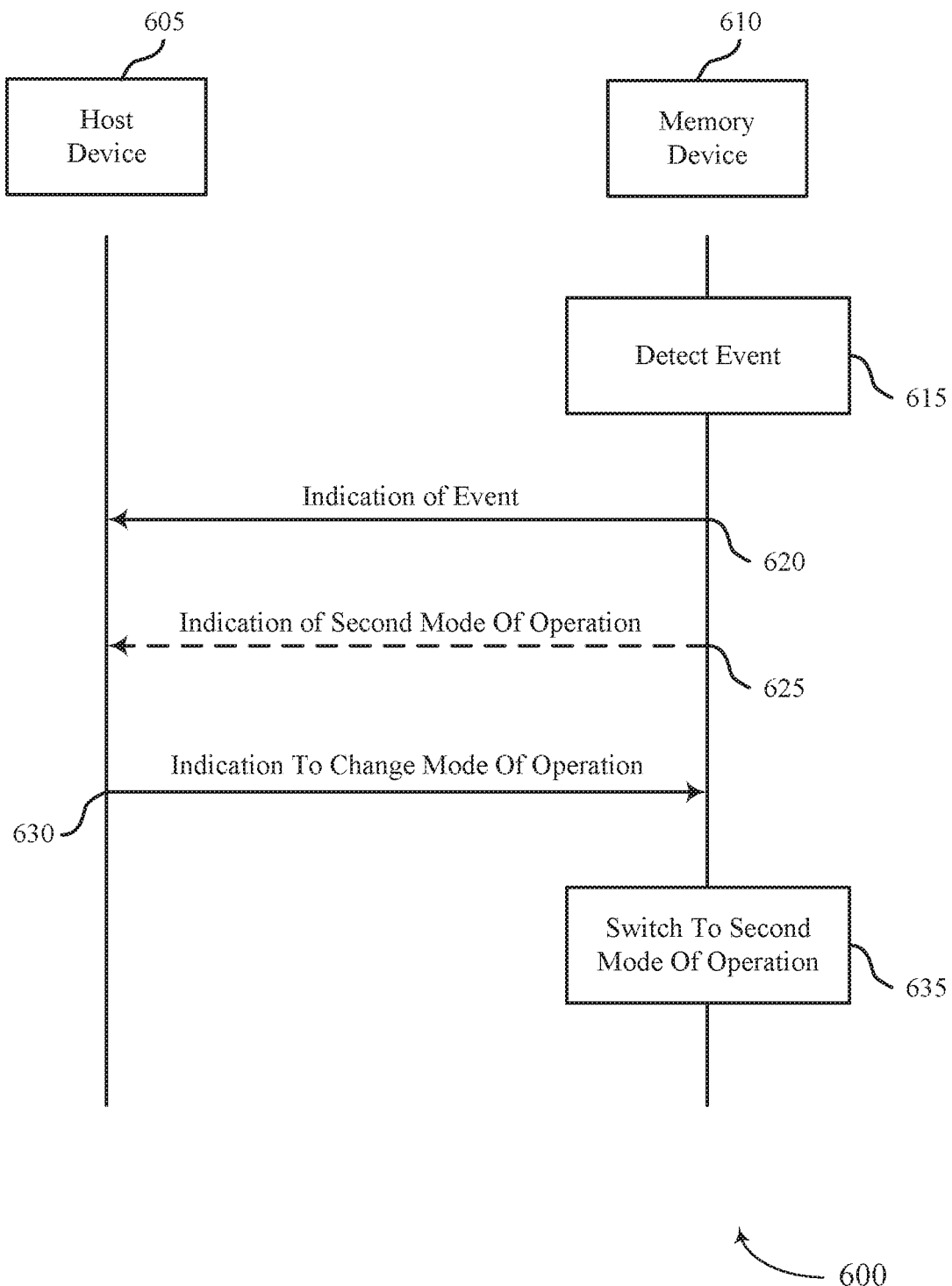

FIG. 6 illustrates an example of a process flow 600 that supports safety event detection for a memory device as disclosed herein. The process flow 600 may be implemented by aspects of the systems 100 and 300 and memory die 200 described with reference to FIGS. 1 through 3. The process flow 600 may include operations performed by a host device 605, which may be an example of host device 305 as described with reference to FIG. 3. Host device 605 may implement aspects of the external memory controller 105 as described with reference to FIG. 1. The process flow 600 may further include operations performed by a memory device 610, which may be an example of the memory device 110, the memory array 170, or the memory die 200, or the memory device 310 as described with reference to FIGS. 1 through 3.

At 615, the memory device 610 may detect an event that is associated with a reduction in data integrity of a memory array of the memory device 610. In some cases, the memory device 610 may be operating according to a first mode (e.g., a normal mode) of operation at 615.

At 620, the memory device may transmit an indication of the event to the host device 605. The event may correspond to one or more of an execution error, a quantity of row access commands that satisfies a first threshold, a refresh rate that does not satisfy a second threshold, an error condition for a channel of a bus, an invalid command, a temperature condition, or a voltage condition.

At 625, the memory device may optionally transmit an indication of a second mode (e.g., a safe mode) of operation to the host device 605. That is, the memory device 610 may determine a type of operation for the safe mode of operation based on the type of event detected and transmit the indication of the type of safe mode to the host device 605. The second mode of operation may be one of a plurality of preconfigured modes of adjusted operation of the memory device 610. In some cases, the plurality of preconfigured modes may include increasing a refresh rate of the memory array, adjusting a bus configuration of the memory device, blocking one or more commands from the host device, blocking commands to one or more banks or sections of the memory array, operating one or more banks of the memory array according to a self-refresh mode, or adjusting a speed configuration for the memory device.

At 630, the host device 605 may transmit an indication to change the mode of operation of the memory device 610. That is, the memory device 610 may receive signaling, from the host device 605 responsive to transmitting the indication of the event. The signaling may indicate that the memory device 610 should change from the first mode of operation to the second mode of operation. The signaling may or may not include an explicit indication of the second mode of operation. That is, the memory device 610 may indicate the second mode of operation at 625 and the host device 605 may indicate to change modes without explicitly indicating the second mode of operation, or may explicitly indicate the second mode of operation, which may be the same or different than the second mode of operation indicated by the memory device 610 at 625. In some examples, the signaling may include the host device 605 setting a register at the memory device 610. Here, the memory device 610 may detect the value set by the host device 605, where the value indicates to change the operation of the memory device 610 to the second mode of operation.

At 635, the memory device 610 may switch the operation of the memory device 610 from the first mode of operation to the second mode of operation. The memory device 610 may switch based on receiving the signaling from the host device 605. The second mode of operation may be based on the event detected at the memory array.

Figure 7:
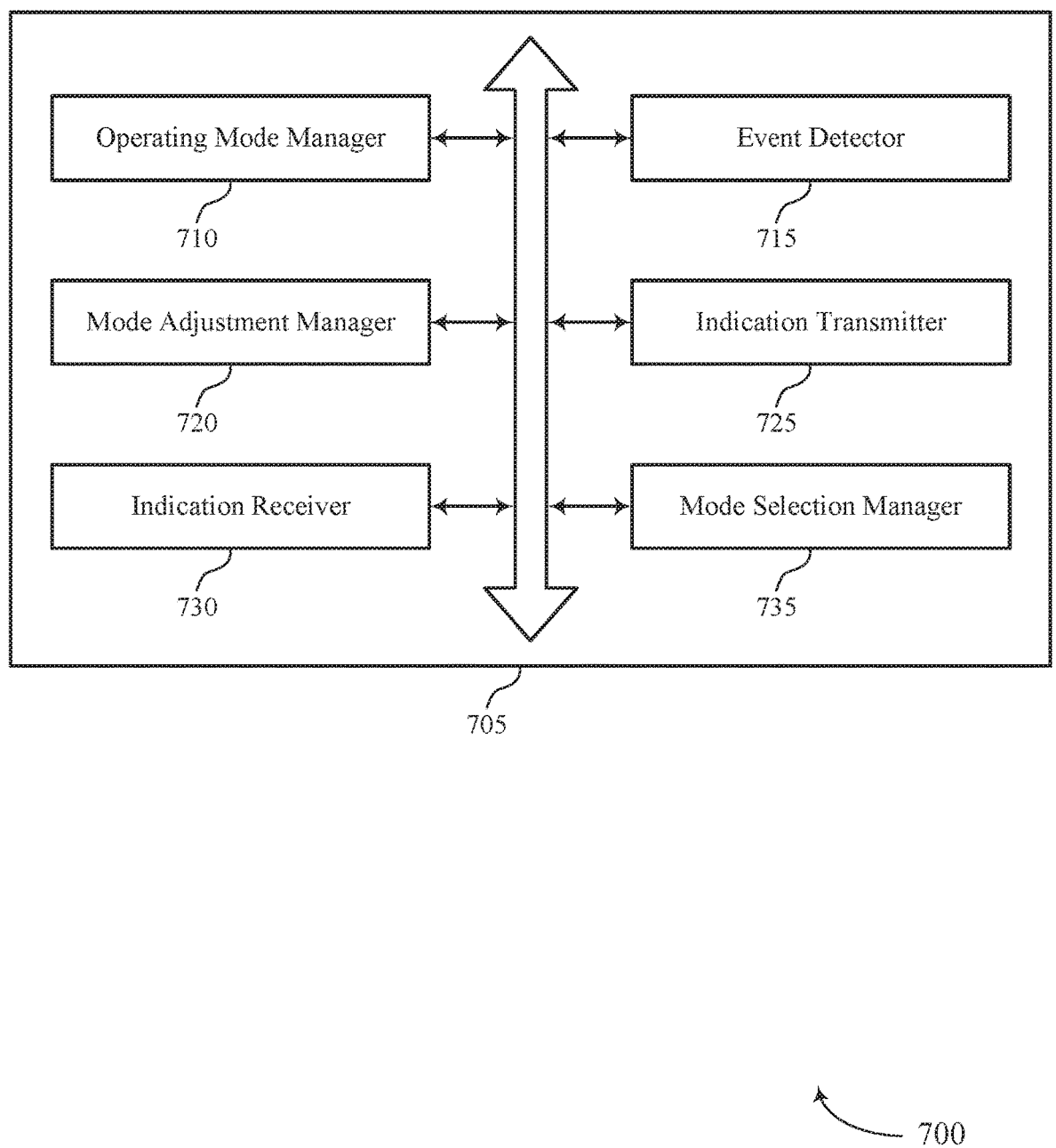
FIG. 7 shows a block diagram of a device that supports safety event detection for a memory device as disclosed herein.

FIG. 7 shows a block diagram 700 of a device 705 that supports safety event detection for a memory device as disclosed herein. The device 705 may include aspects of memory device 110, memory device 310, memory device 510, and memory device 610 as disclosed herein with reference to FIGS. 1, 3, 5, and 6. The device 705 may include an operating mode manager 710, an event detector 715, a mode adjustment manager 720, an indication transmitter 725, an indication receiver 730, and a mode selection manager 735. Each of these modules may communicate, directly or indirectly, with one another (e.g., via one or more buses).

The operating mode manager 710 may operate a memory array of a memory device in a first mode of operation.

The event detector 715 may detect an event at the memory device associated with a reduction of data integrity for the memory array. The event may correspond to an execution error, a quantity of row access commands that satisfies a first threshold, a refresh rate that does not satisfy a second threshold, an error condition for a channel of a bus, an invalid command, a temperature condition, or a voltage condition, or a combination thereof. In some examples, the event detector 715 may detect a first event that does not satisfy the condition of the configuration for operation adjustment. In some cases, the event detector 715 may detect a second event that does not satisfy the condition of the configuration for operation adjustment. In some instances, the event detector 715 may determine that a combination of the first event and the second event satisfies the condition of the configuration for operation adjustment.

The mode adjustment manager 720 may determine, based on the event and a configuration for operation adjustment, whether to adjust an operation of the memory device from the first mode of operation to a second mode of operation. In some examples, the mode adjustment manager 720 may determine that the detected event satisfies a condition of the configuration for operation adjustment. Here, the mode adjustment manager 720 may autonomously adjust the operation of the memory device from the first mode of operation to the second mode of operation based on determining that the detected event satisfies the condition. In some other examples, the mode adjustment manager 720 may determine that the detected event does not satisfy a condition of the configuration for operation adjustment. Here, the mode adjustment manager 720 may continue to operate the memory array of the memory device in the first mode of operation.

The indication transmitter 725 may transmit, to a host device, signaling including an indication of the event, or an indication of the adjustment of the operation of the memory device from the first mode of operation to the second mode of operation, or both. In some cases, the signaling to the host device includes an indication of the adjusting the operation of the memory device. In some examples, the signaling to the host device includes an indication of the selected second mode of operation.

The indication receiver 730 may receive, from the host device, signaling indicating the configuration for operation adjustment, where determining whether to adjust the operation of the memory device is based on receiving the signaling indicating the configuration.

The mode selection manager 735 may select the second mode of operation from a set of modes of operation according to the configuration for operation adjustment, where adjusting the operation of the memory device from the first mode of operation to the second mode of operation is based on the selecting. The plurality of modes of operation may include increasing a refresh rate of the memory array, adjusting a bus configuration of the memory device, blocking one or more commands from the host device, blocking commands to one or more banks or sections of the memory array, operating one or more banks of the memory array according to a self-refresh mode, adjusting a speed configuration for access to the memory array, or a combination thereof.

The event detector 715 may detect, in a first mode of operation, an event at the memory device that is associated with a reduction in data integrity of a memory array of the memory device. The event may correspond to one or more of an execution error, a quantity of row access commands that satisfies a first threshold, a refresh rate that does not satisfy a second threshold, an error condition for a channel of a bus, an invalid command, a temperature condition, or a voltage condition.

The mode selection manager 735 may determine a second mode of operation (e.g., to indicate to the host device). The second mode of operation may be one of a set of preconfigured modes of adjusted operation of the memory device, where the second mode of operation is based on a type of the event detected at the memory array. In some cases, the set of preconfigured modes of adjusted operation includes increasing a refresh rate of the memory array, adjusting a bus configuration of the memory device, blocking one or more commands from the host device, blocking commands to one or more banks or sections of the memory array, operating one or more banks of the memory array according to a self-refresh mode, or adjusting a speed configuration for the memory device.

The indication transmitter 725 may transmit, to a host device, an indication of the event. In some examples, the indication transmitter 725 may transmit, to the host device, an indication of the second mode of operation, where receiving signaling from the host device indicating to change the operation of the memory device is based on transmitting the indication of the second mode of operation.

The indication receiver 730 may receive signaling, from the host device responsive to transmitting the indication of the event, indicating that the memory device should change from the first mode of operation to a second mode of operation. In some examples, the indication receiver 730 may receive a command to change the operation of the memory device to the second mode of operation. In some other examples, the indication receiver 730 may detect a value set by the host device for a register of the memory device, the value indicating to change the operation of the memory device to the second mode of operation.

The mode adjustment manager 720 may switch the operation of the memory device from the first mode of operation to the second mode of operation based on the signaling.

Figure 8:
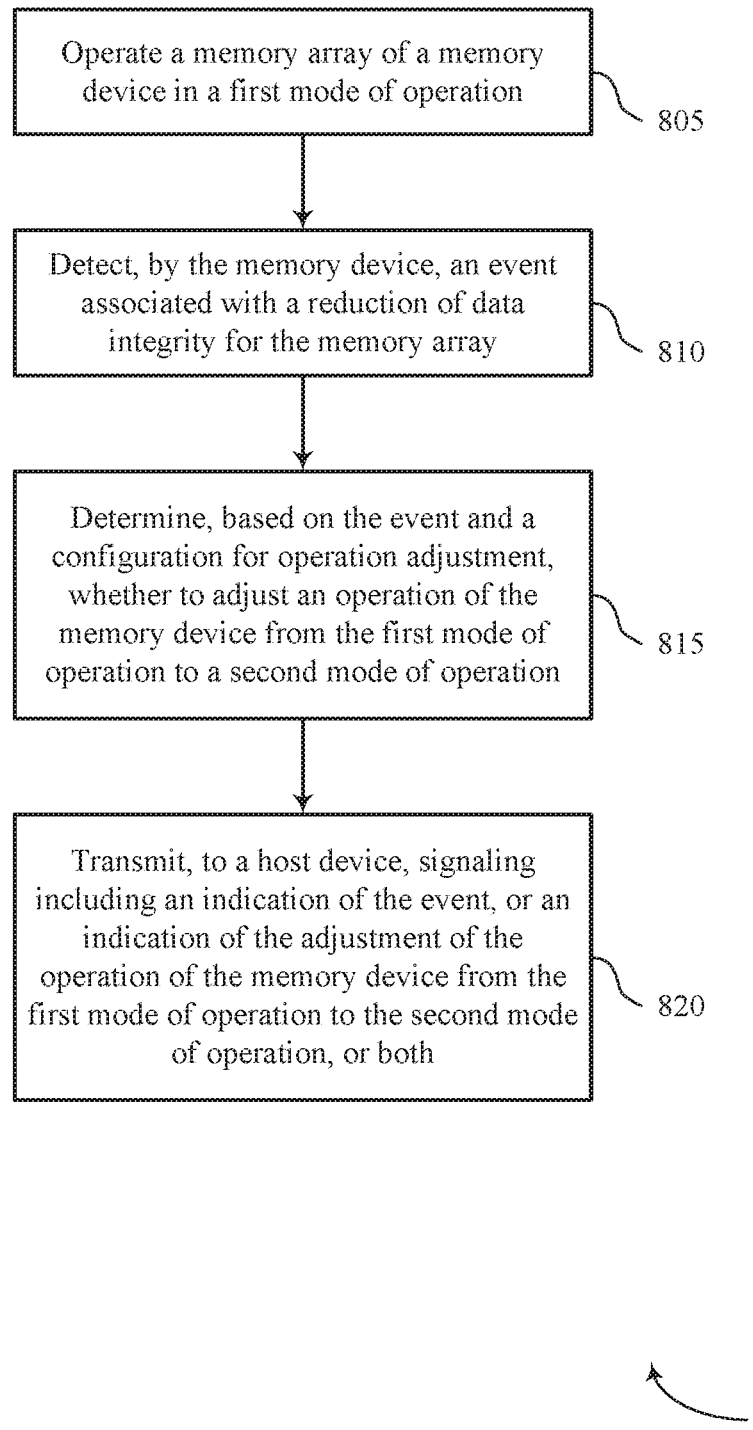
FIGS. 8 through 10 show flowcharts illustrating a method or methods that supports safety event detection for a memory device as disclosed herein.

FIG. 8 shows a flowchart illustrating a method 800 that supports safety event detection for a memory device as disclosed herein. The operations of method 800 may be implemented by a memory device (e.g., memory device 110, memory device 310, memory device 510, and memory device 610 as disclosed herein with reference to FIGS. 1, 3, 5, and 6) or its components as described herein. For example, the operations of method 800 may be performed by a device as described with reference to FIG. 7. In some examples, a memory device may execute a set of instructions to control the functional elements of the memory device to perform the functions described below. Additionally or alternatively, a memory device may perform aspects of the functions described below using special-purpose hardware.

At 805, the memory device may operate a memory array of a memory device in a first mode of operation. The operations of 805 may be performed according to the methods described herein. In some examples, aspects of the operations of 805 may be performed by an operating mode manager as described with reference to FIG. 7.

At 810, the memory device may detect, by the memory device, an event associated with a reduction of data integrity for the memory array. The operations of 810 may be performed according to the methods described herein. In some examples, aspects of the operations of 810 may be performed by an event detector as described with reference to FIG. 7.

At 815, the memory device may determine, based on the event and a configuration for operation adjustment, whether to adjust an operation of the memory device from the first mode of operation to a second mode of operation. The operations of 815 may be performed according to the methods described herein. In some examples, aspects of the operations of 815 may be performed by a mode adjustment manager as described with reference to FIG. 7.

At 820, the memory device may transmit, to a host device, signaling including an indication of the event, or an indication of the adjustment of the operation of the memory device from the first mode of operation to the second mode of operation, or both. The operations of 820 may be performed according to the methods described herein. In some examples, aspects of the operations of 820 may be performed by an indication transmitter as described with reference to FIG. 7.

Some examples of the method 800 and the apparatus described herein may further include operations, features, means, or instructions for operating a memory array of a memory device in a first mode of operation, detecting, by the memory device, an event associated with a reduction of data integrity for the memory array, determining, based on the event and a configuration for operation adjustment, whether to adjust an operation of the memory device from the first mode of operation to a second mode of operation, and transmitting, to a host device, signaling including an indication of the event, or an indication of the adjustment of the operation of the memory device from the first mode of operation to the second mode of operation, or both.

In some instances of the method 800 and the apparatus described herein, the event corresponds to an execution error, a quantity of row access commands that satisfies a first threshold, a refresh rate that does not satisfy a second threshold, an error condition for a channel of a bus, an invalid command, a temperature condition, or a voltage condition, or a combination thereof.

Some cases of the method 800 and the apparatus described herein may further include operations, features, means, or instructions for receiving, from the host device, signaling indicating the configuration for operation adjustment, where determining whether to adjust the operation of the memory device may be based on receiving the signaling indicating the configuration.

In some examples of the method 800 and the apparatus described herein, determining whether to adjust the operation of the memory device may include operations, features, means, or instructions for determining that the detected event satisfies a condition of the configuration for operation adjustment, and autonomously adjusting the operation of the memory device from the first mode of operation to the second mode of operation based on determining that the detected event satisfies the condition.

In some cases of the method 800 and the apparatus described herein, detecting the event may include operations, features, means, or instructions for detecting a first event that does not satisfy the condition of the configuration for operation adjustment, detecting a second event that does not satisfy the condition of the configuration for operation adjustment, and determining that a combination of the first event and the second event satisfies the condition of the configuration for operation adjustment.

In some instances of the method 800 and the apparatus described herein, the signaling to the host device includes an indication of the adjustment of the operation of the memory device.

Some examples of the method 800 and the apparatus described herein may further include operations, features, means, or instructions for selecting the second mode of operation from a set of modes of operation according to the configuration for operation adjustment, where adjusting the operation of the memory device from the first mode of operation to the second mode of operation may be based on the selecting.

In some cases of the method 800 and the apparatus described herein, the set of modes of operation may include operations, features, means, or instructions for increasing a refresh rate of the memory array, adjusting a bus configuration of the memory device, blocking one or more commands from the host device, blocking commands to one or more banks or sections of the memory array, operating one or more banks of the memory array according to a self-refresh mode, adjusting a speed configuration for access to the memory array, or a combination thereof.

In some examples of the method 800 and the apparatus described herein, the signaling to the host device includes an indication of the selected second mode of operation.

In some cases of the method 800 and the apparatus described herein, determining whether to adjust the operation of the memory device further may include operations, features, means, or instructions for determining that the detected event does not satisfy a condition of the configuration for operation adjustment, and continuing to operate the memory array of the memory device in the first mode of operation.

In some cases, an apparatus configured for safety event detection for a memory device may perform aspects of the function described herein using general- or special-purpose hardware. The apparatus may include a memory array having a set of memory cells, a memory interface coupled with the memory array and operable to receive commands from a host device, and circuitry coupled with the memory array and the memory interface. The circuitry may be operable to cause the device to execute a command received from the host device using a first mode of operation, detect an event associated with a reduction of data integrity for the memory array, compare the event to a condition of a configuration for operation adjustment, determine whether to adjust an operation of the memory array from the first mode of operation to a second mode of operation based on comparing the event to the condition, and transmit, to the host device, signaling that indicates the event, or that indicates the adjustment of the operation of the memory device from the first mode of operation to the second mode of operation, or both.

In some cases, the event corresponds to one or more of an execution error, a quantity of row access commands that satisfies a first threshold, a refresh rate that does not satisfy a second threshold, an error condition for a channel of a bus, an invalid command, a temperature condition, a voltage condition, or a combination thereof.

In some examples, the circuitry may be further configured to determine that the event satisfies the condition of the configuration for operation adjustment based on the comparing the event to the condition, autonomously adjust the mode of operation of the memory array to the second mode of operation based on determining that the event satisfies the condition of the configuration for operation adjustment, and execute a second command received from the host device using the second mode of operation.

In some cases, the signaling indicates the adjusting the mode of operation to the second mode of operation.

In some instances, the second mode of operation may be based on a type of the detected event and includes increasing a refresh rate of the memory array, adjusting a bus configuration of the memory device, blocking one or more commands from the host device, blocking commands to one or more banks or sections of the memory array, operating one or more banks of the memory array according to a self-refresh mode, adjusting a speed configuration for the memory array, or a combination thereof.

In some examples, the circuitry may be further configured to determine that the event does not satisfy the condition of the configuration for operation adjustment based on the comparing the event to the condition, and execute a second command received from the host device according to the first mode of operation.

Figure 9:
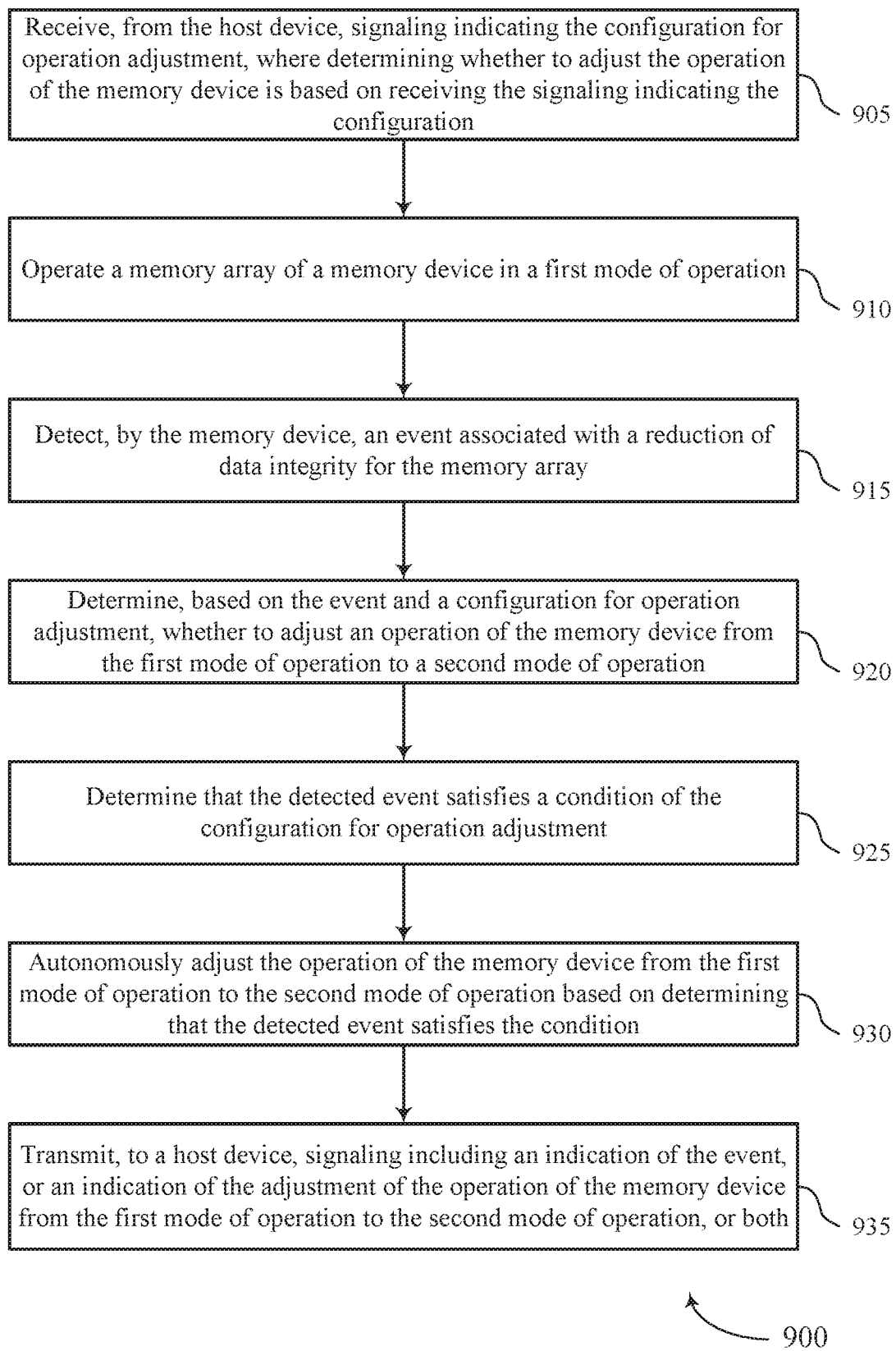

FIG. 9 shows a flowchart illustrating a method 900 that supports safety event detection for a memory device as disclosed herein. The operations of method 900 may be implemented by a memory device (e.g., memory device 110, memory device 310, memory device 510, and memory device 610 as disclosed herein with reference to FIGS. 1, 3, 5, and 6) or its components as described herein. For example, the operations of method 900 may be performed by a device as described with reference to FIG. 7. In some examples, a memory device may execute a set of instructions to control the functional elements of the memory device to perform the functions described below. Additionally or alternatively, a memory device may perform aspects of the functions described below using special-purpose hardware.

At 905, the memory device may receive, from the host device, signaling indicating the configuration for operation adjustment, where determining whether to adjust the operation of the memory device is based on receiving the signaling indicating the configuration. The operations of 905 may be performed according to the methods described herein. In some examples, aspects of the operations of 905 may be performed by an indication receiver as described with reference to with reference to FIG. 7.

At 910, the memory device may operate a memory array of a memory device in a first mode of operation. The operations of 910 may be performed according to the methods described herein. In some examples, aspects of the operations of 910 may be performed by an operating mode manager as described with reference to with reference to FIG. 7.

At 915, the memory device may detect, by the memory device, an event associated with a reduction of data integrity for the memory array. The operations of 915 may be performed according to the methods described herein. In some examples, aspects of the operations of 915 may be performed by an event detector as described with reference to with reference to FIG. 7.

At 920, the memory device may determine, based on the event and a configuration for operation adjustment, whether to adjust an operation of the memory device from the first mode of operation to a second mode of operation. The operations of 920 may be performed according to the methods described herein. In some examples, aspects of the operations of 920 may be performed by a mode adjustment manager as described with reference to with reference to FIG. 7.

At 925, the memory device may determine that the detected event satisfies a condition of the configuration for operation adjustment. The operations of 925 may be performed according to the methods described herein. In some examples, aspects of the operations of 925 may be performed by a mode adjustment manager as described with reference to FIG. 7.

At 930, the memory device may autonomously adjust the operation of the memory device from the first mode of operation to the second mode of operation based on determining that the detected event satisfies the condition. The operations of 930 may be performed according to the methods described herein. In some examples, aspects of the operations of 930 may be performed by a mode adjustment manager as described with reference to FIG. 7.

At 935, the memory device may transmit, to a host device, signaling including an indication of the event, or an indication of the adjustment of the operation of the memory device from the first mode of operation to the second mode of operation, or both. The operations of 935 may be performed according to the methods described herein. In some examples, aspects of the operations of 935 may be performed by an indication transmitter as described with reference to FIG. 7.

Figure 10:
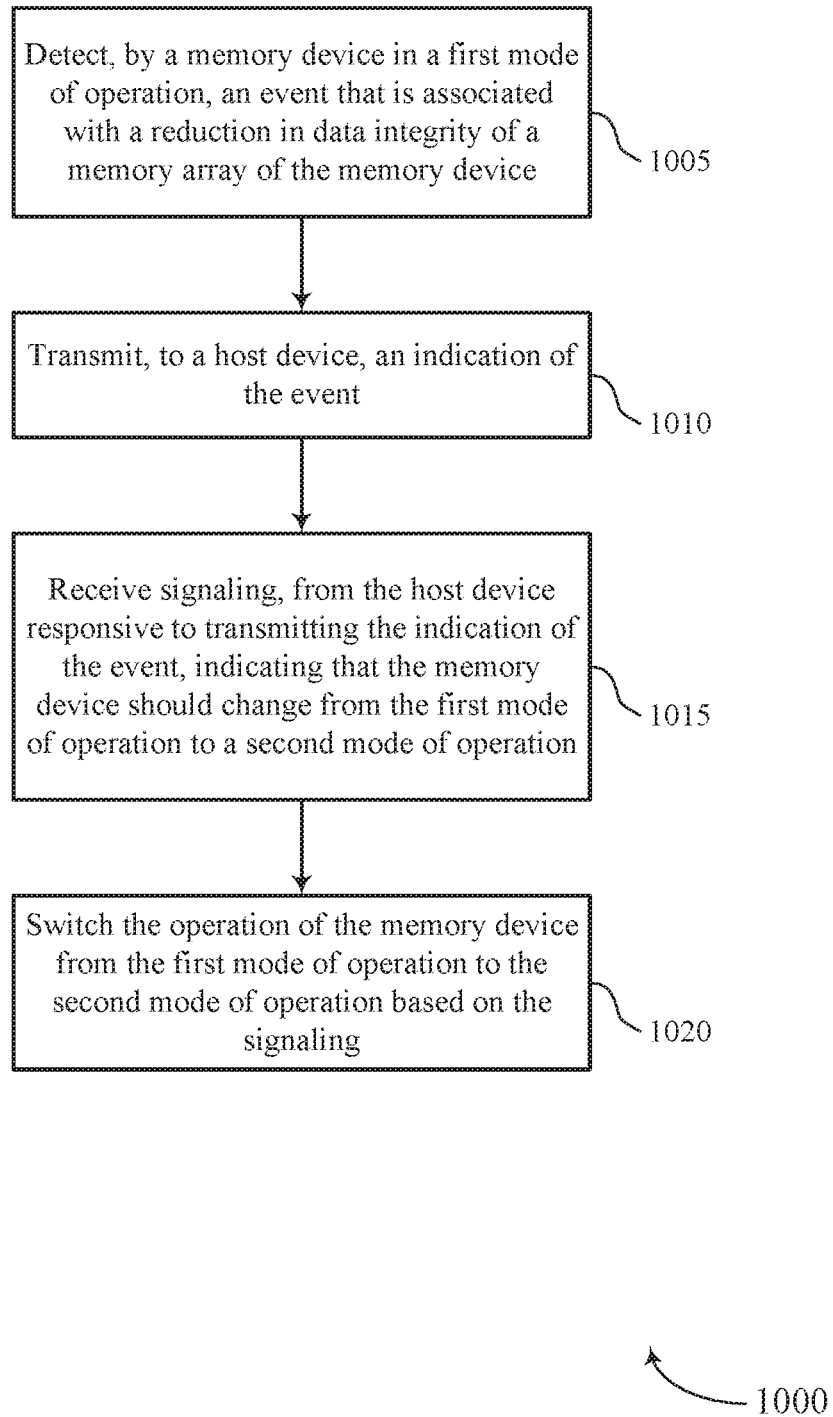

FIG. 10 shows a flowchart illustrating a method 1000 that supports safety event detection for a memory device as disclosed herein. The operations of method 1000 may be implemented by a memory device (e.g., memory device 110, memory device 310, memory device 510, and memory device 610 as disclosed herein with reference to FIGS. 1, 3, 5, and 6) or its components as described herein. For example, the operations of method 1000 may be performed by a device as described with reference to FIG. 7. In some examples, a memory device may execute a set of instructions to control the functional elements of the memory device to perform the functions described below. Additionally or alternatively, a memory device may perform aspects of the functions described below using special-purpose hardware.

At 1005, the memory device may detect, by a memory device in a first mode of operation, an event that is associated with a reduction in data integrity of a memory array of the memory device. The operations of 1005 may be performed according to the methods described herein. In some examples, aspects of the operations of 1005 may be performed by an event detector as described with reference to FIG. 7.

At 1010, the memory device may transmit, to a host device, an indication of the event. The operations of 1010 may be performed according to the methods described herein. In some examples, aspects of the operations of 1010 may be performed by an indication transmitter as described with reference to FIG. 7.

At 1015, the memory device may receive signaling, from the host device responsive to transmitting the indication of the event, indicating that the memory device should change from the first mode of operation to a second mode of operation. The operations of 1015 may be performed according to the methods described herein. In some examples, aspects of the operations of 1015 may be performed by an indication receiver as described with reference to FIG. 7.

At 1020, the memory device may switch the operation of the memory device from the first mode of operation to the second mode of operation based on the signaling. The operations of 1020 may be performed according to the methods described herein. In some examples, aspects of the operations of 1020 may be performed by a mode adjustment manager as described with reference to FIG. 7.

Some examples of the method 1000 and the apparatus described herein may further include operations, features, means, or instructions for detecting, by a memory device in a first mode of operation, an event that is associated with a reduction in data integrity of a memory array of the memory device, transmitting, to a host device, an indication of the event, receiving signaling, from the host device responsive to transmitting the indication of the event, indicating that the memory device should change from the first mode of operation to a second mode of operation, and switching the operation of the memory device from the first mode of operation to the second mode of operation based on the signaling.

In some cases of the method 1000 and the apparatus described herein, the event corresponds to one or more of an execution error, a quantity of row access commands that satisfies a first threshold, a refresh rate that does not satisfy a second threshold, an error condition for a channel of a bus, an invalid command, a temperature condition, or a voltage condition.

In some examples of the method 1000 and the apparatus described herein, receiving the signaling from the host device further may include operations, features, means, or instructions for receiving a command to change the operation of the memory device to the second mode of operation; or detecting a value set by the host device for a register of the memory device, the value indicating to change the operation of the memory device to the second mode of operation.

Some cases of the method 1000 and the apparatus described herein may further include operations, features, means, or instructions for transmitting, to the host device, an indication of the second mode of operation, where receiving signaling from the host device indicating to change the operation of the memory device may be based on transmitting the indication of the second mode of operation.

In some instances of the method 1000 and the apparatus described herein, the second mode of operation may be one of a set of preconfigured modes of adjusted operation of the memory device, where the second mode of operation may be based on a type of the event detected at the memory array.

In some examples of the method 1000 and the apparatus described herein, the set of preconfigured modes of adjusted operation includes increasing a refresh rate of the memory array, adjusting a bus configuration of the memory device, blocking one or more commands from the host device, blocking commands to one or more banks or sections of the memory array, operating one or more banks of the memory array according to a self-refresh mode, or adjusting a speed configuration for the memory device.

It should be noted that the methods described herein describe possible implementations, and that the operations and the steps may be rearranged or otherwise modified and that other implementations are possible. Further, aspects from two or more of the methods may be combined.

In some examples, an apparatus configured for safety event detection for a memory device may perform aspects of the function described herein using general- or special-purpose hardware. The apparatus may include a memory array having a set of memory cells, a memory interface coupled with the memory array and operable to receive commands from a host device, and circuitry coupled with the memory array and the memory interface. The circuitry may be operable to cause the device to detect, while in a first mode of operation, an event associated with a reduction of data integrity for the memory array, transmit, to the host device, signaling indicating the event, receive, from the host device responsive to the signaling indicating the event, an indication for transitioning the memory array to a second mode of operation associated with an increased data retention of the memory array, and operate the memory array using the second mode of operation based on receiving the indication.

In some cases, the memory interface may be further configured to receive a command from the host device, where the command indicates to transition the memory array to the second mode of operation.

In some examples, the circuitry may be further configured to detect a value set by the host device for a register of a memory device, the value indicating the second mode of operation, where receiving the indication to transition the memory array to the second mode of operation may be based on detecting the value stored at the register.

In some instances, the circuitry may be further operable to transmit, to the host device, an indication of the second mode of operation, where receiving the indication to transition the memory array to the second mode of operation may be based on transmitting the indication of the second mode of operation to the host device.

In some cases, the second mode of operation may be one of a set of preconfigured modes of adjusted operation of a memory device that may be based on a type of the event detected at the memory array.

In some examples, an apparatus configured for safety event detection for a memory device may perform aspects of the function described herein using general or special-purpose hardware. The apparatus may include an interface coupled with a memory device, a controller coupled to the interface and operable to receive, from the memory device operating in a first mode of operation, signaling indicating an event associated with a reduction of data integrity for a memory array of the memory device, compare the event to a condition indicated by a configuration for operation adjustment, determine, based on the comparing, to change a mode of operation of the memory device from the first mode of operation to a second mode of operation associated with an increased data retention of the memory device, and transmit, to the memory device, an indication to change to the second mode of operation.

In some cases, the controller may be further operable to receive, from the memory device, an indication of a recommended change to the second mode of operation, where transmitting the indication to change the mode of operation to the second mode of operation may be based at least in part receiving the indication of the recommended change from the memory device.

In some examples, the second mode of operation includes increasing a refresh rate of the memory array, adjusting a bus configuration of the memory device, blocking one or more commands from a host device, blocking commands to one or more banks or sections of the memory array, operating one or more banks of the memory array according to a self-refresh mode, adjusting a speed configuration for the memory device, or a combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
operating a memory array of a memory device in a first mode of operation;
detecting, by the memory device, an event associated with a reduction of data integrity for the memory array;
determining, based at least in part on the event and a configuration for operation adjustment, whether to adjust an operation of the memory device from the first mode of operation to a second mode of operation;
autonomously adjusting the operation of the memory device from the first mode of operation to the second mode of operation based at least in part on determining that the detected event satisfies a condition of the configuration for operation adjustment; and
transmitting, to a host device, signaling comprising an indication of the adjustment of the operation of the memory device from the first mode of operation to the second mode of operation.

2. The method of claim 1, wherein the event corresponds to an execution error, a quantity of row access commands that satisfies a first threshold, a refresh rate that does not satisfy a second threshold, an error condition for a channel of a bus, an invalid command, a temperature condition, or a voltage condition, or a combination thereof.

3. The method of claim 1, further comprising:
receiving, from the host device, signaling indicating the configuration for operation adjustment, wherein determining whether to adjust the operation of the memory device is based at least in part on receiving the signaling indicating the configuration.

4. The method of claim 1, wherein detecting the event comprises:
   detecting a first event that does not satisfy the condition of the configuration for operation adjustment;
   detecting a second event that does not satisfy the condition of the configuration for operation adjustment; and
   determining that a combination of the first event and the second event satisfies the condition of the configuration for operation adjustment.

5. The method of claim 1, further comprising:
   selecting the second mode of operation from a plurality of modes of operation according to the configuration for operation adjustment, wherein adjusting the operation of the memory device from the first mode of operation to the second mode of operation is based at least in part on the selecting.

6. The method of claim 5, wherein the plurality of modes of operation comprises:
   increasing a refresh rate of the memory array, adjusting a bus configuration of the memory device, blocking one or more commands from the host device, blocking commands to one or more banks or sections of the memory array, operating one or more banks of the memory array according to a self-refresh mode, adjusting a speed configuration for access to the memory array, or a combination thereof.

7. The method of claim 5, wherein the signaling to the host device comprises an indication of the selected second mode of operation.

8. The method of claim 1, wherein determining whether to adjust the operation of the memory device further comprises:
   determining that the detected event does not satisfy a condition of the configuration for operation adjustment; and
   continuing to operate the memory array of the memory device in the first mode of operation.

9. A device, comprising:
   a memory array having a plurality of memory cells;
   a memory interface coupled with the memory array and operable to receive commands from a host device; and
   circuitry coupled with the memory array and the memory interface, the circuitry operable to cause the device to:
      execute a command received from the host device using a first mode of operation;
      detect an event associated with a reduction of data integrity for the memory array;
      compare the event to a condition of a configuration for operation adjustment;
      determine whether to adjust an operation of the memory array from the first mode of operation to a second mode of operation based at least in part on comparing the event to the condition;
      autonomously adjust the operation of the memory device from the first mode of operation to the second mode of operation based at least in part on determining that the detected event satisfies a condition of the configuration for operation adjustment; and
      transmit, to the host device, signaling that indicates the adjustment of the operation of the memory array from the first mode of operation to the second mode of operation.

10. The device of claim 9, wherein the event corresponds to one or more of an execution error, a quantity of row access commands that satisfies a first threshold, a refresh rate that does not satisfy a second threshold, an error condition for a channel of a bus, an invalid command, a temperature condition, a voltage condition, or a combination thereof.

11. The device of claim 9, the circuitry further operable to:
   determine that the event satisfies the condition of the configuration for operation adjustment based at least in part on the comparing the event to the condition;
   autonomously adjust the operation of the memory array to the second mode of operation based at least in part on determining that the event satisfies the condition of the configuration for operation adjustment; and
   execute a second command received from the host device using the second mode of operation.

12. The device of claim 11, wherein the signaling indicates the adjusting the operation to the second mode of operation.

13. The device of claim 9, wherein the second mode of operation is based at least in part on a type of the detected event and comprises increasing a refresh rate of the memory array, adjusting a bus configuration of the device, blocking one or more commands from the host device, blocking commands to one or more banks or sections of the memory array, operating one or more banks of the memory array according to a self-refresh mode, adjusting a speed configuration for the memory array, or a combination thereof.

14. The device of claim 9, the circuitry further operable to:
   determine that the event does not satisfy the condition of the configuration for operation adjustment based at least in part on the comparing the event to the condition; and
   execute a second command received from the host device according to the first mode of operation.

15. A method, comprising:
   detecting, by a memory device in a first mode of operation, an event that is associated with a reduction in data integrity of a memory array of the memory device;
   transmitting, to a host device, an indication of the event;
   transmitting, to the host device, an indication of a second mode of operation;
   receiving signaling, from the host device responsive to transmitting the indication of the event, indicating that the memory device should change from the first mode of operation to the second mode of operation, the receiving based at least in part on transmitting the indication of the second mode of operation; and
   switching an operation of the memory device from the first mode of operation to the second mode of operation based at least in part on the signaling.

16. The method of claim 15, wherein the event corresponds to one or more of an execution error, a quantity of row access commands that satisfies a first threshold, a refresh rate that does not satisfy a second threshold, an error condition for a channel of a bus, an invalid command, a temperature condition, or a voltage condition.

17. The method of claim 15, wherein receiving the signaling from the host device further comprises:
   receiving a command to change the operation of the memory device to the second mode of operation; or
   detecting a value set by the host device for a register of the memory device, the value indicating to change the operation of the memory device to the second mode of operation.

18. The method of claim 15, wherein the second mode of operation is one of a plurality of preconfigured modes of adjusted operation of the memory device, wherein the second mode of operation is based at least in part on a type of the event detected at the memory array.

19. The method of claim 18, wherein the plurality of preconfigured modes of adjusted operation comprises increasing a refresh rate of the memory array, adjusting a bus configuration of the memory device, blocking one or more commands from the host device, blocking commands to one or more banks or sections of the memory array, operating one or more banks of the memory array according to a self-refresh mode, or adjusting a speed configuration for the memory device.

20. A device, comprising:
a memory array having a plurality of memory cells;
a memory interface coupled with the memory array and operable to receive commands from a host device; and
circuitry coupled with the memory array and the memory interface, the circuitry operable to cause the device to:
detect, while in a first mode of operation, an event associated with a reduction of data integrity for the memory array;
detect a value set by the host device for a resister of a memory device, the value indicating a second mode of operation;
transmit, to the host device, signaling indicating the event;
receive, from the host device responsive to the signaling indicating the event, an indication for transitioning the memory array to the second mode of operation associated with an increased data retention of the memory array, wherein receiving the indication is based at least in part on detecting the value stored at the resister; and
operate the memory array using the second mode of operation based at least in part on receiving the indication.

21. The device of claim 20, the memory interface operable to:
receive a command from the host device, wherein the command indicates to transition the memory array to the second mode of operation.

22. A device, comprising:
a memory array having a plurality of memory cells;
a memory interface coupled with the memory array and operable to receive commands from a host device; and
circuitry coupled with the memory array and the memory interface, the circuitry operable to cause the device to:
detect, while in a first mode of operation, an event associated with a reduction of data integrity for the memory array;
transmit, to the host device, signaling indicating the event;
transmit, to the host device, an indication of a second mode of operation, wherein receiving the indication to transition the memory array to the second mode of operation is based at least in part on transmitting the indication of the second mode of operation to the host device;
receive, from the host device responsive to the signaling indicating the event, an indication for transitioning the memory array to the second mode of operation associated with an increased data retention of the memory array; and
operate the memory array using the second mode of operation based at least in part on receiving the indication.

23. A device, comprising:
a memory array having a plurality of memory cells;
a memory interface coupled with the memory array and operable to receive commands from a host device; and
circuitry coupled with the memory array and the memory interface, the circuitry operable to cause the device to:
detect, while in a first mode of operation, an event associated with a reduction of data integrity for the memory array;
transmit, to the host device, signaling indicating the event;
receive, from the host device responsive to the signaling indicating the event, an indication for transitioning the memory array to a second mode of operation associated with an increased data retention of the memory array, wherein the second mode of operation is one of a plurality of preconfigured modes of adjusted operation of a memory device that is based at least in part on a type of the event detected at the memory array; and
operate the memory array using the second mode of operation based at least in part on receiving the indication.

24. A device, comprising:
an interface coupled with a memory device; and
a controller coupled to the interface and operable to:
receive, from the memory device operating in a first mode of operation, signaling indicating an event associated with a reduction of data integrity for a memory array of the memory device;
receive, from the memory device, an indication of a recommended change to a second mode of operation;
compare the event to a condition indicated by a configuration for operation adjustment;
determine, based at least in part on the comparing, to change a mode of operation of the memory device from the first mode of operation to the second mode of operation associated with an increased data retention of the memory device; and
transmit, to the memory device, an indication to change to the second mode of operation based at least in part on receiving the indication of the recommended change from the memory device.

25. The device of claim 24, wherein the second mode of operation comprises increasing a refresh rate of the memory array, adjusting a bus configuration of the memory device, blocking one or more commands from a host device, blocking commands to one or more banks or sections of the memory array, operating one or more banks of the memory array according to a self-refresh mode, adjusting a speed configuration for the memory device, or a combination thereof.

* * * * *